United States Patent
Yamauchi et al.

(10) Patent No.: US 7,586,189 B2
(45) Date of Patent: Sep. 8, 2009

(54) HEAT DISSIPATION STRUCTURE ACCOMMODATED IN ELECTRONIC CONTROL DEVICE

(75) Inventors: Satoshi Yamauchi, Anjo (JP); Akihiro Mizutani, Nagoya (JP)

(73) Assignee: Denso Corporation, Kariya, Aichi-Pref. (JP)

( * ) Notice: Subject to any disclaimer, the term of this patent is extended or adjusted under 35 U.S.C. 154(b) by 417 days.

(21) Appl. No.: 11/212,106

(22) Filed: Aug. 26, 2005

(65) Prior Publication Data

US 2006/0043551 A1    Mar. 2, 2006

(30) Foreign Application Priority Data

Aug. 30, 2004    (JP)    ............... 2004-250912

(51) Int. Cl.
*H01L 23/10*    (2006.01)

(52) U.S. Cl. .............. 257/706; 257/E23.097; 438/122; 438/125

(58) Field of Classification Search ........... 257/706, 257/E23.097
See application file for complete search history.

(56) References Cited

U.S. PATENT DOCUMENTS

| | | |
|---|---|---|
| 6,517,744 B1 | 2/2003 | Hara et al. |
| 6,519,154 B1 * | 2/2003 | Chiu .................. 361/704 |
| 6,816,377 B2 | 11/2004 | Itabashi et al. |
| 2004/0233640 A1 | 11/2004 | Itabashi et al. |
| 2004/0233642 A1 | 11/2004 | Ito et al. |
| 2005/0077615 A1 * | 4/2005 | Yu et al. ............. 257/706 |

FOREIGN PATENT DOCUMENTS

| | | |
|---|---|---|
| JP | 2001-261722 | 9/2001 |
| JP | 2003-68952 | 3/2003 |
| JP | 2003-289191 | 10/2003 |
| JP | 2004-6791 | 1/2004 |
| JP | 2004-31495 | 1/2004 |

* cited by examiner

*Primary Examiner*—Thao X Le
*Assistant Examiner*—Ajay K Arora
(74) *Attorney, Agent, or Firm*—Nixon & Vanderhye PC

(57) ABSTRACT

A circuit board mounting electronic components including a heat generating element is accommodated in a casing. A heat dissipation member is disposed between the heat generating element and an inner surface of the casing. The heat dissipation member is thermally bonded to the heat generating element and to the casing. The heat dissipation member is a polymeric material having fluidity. A film for preventing a shifting of the heat dissipation member is disposed between the heat dissipation member and the casing. And, the film is chemically or electrically bonded to the heat dissipation member and to the casing.

42 Claims, 15 Drawing Sheets

HEAT DISSIPATION STRUCTURE ACCOMMODATED IN ELECTRONIC CONTROL DEVICE

CROSS-REFERENCE TO RELATED APPLICATION

This application is based upon and claims the benefit of priority from earlier Japanese Patent Application No. 2004-250912 filed on Aug. 30, 2004 so that the description of which is incorporated herein by reference.

BACKGROUND OF THE INVENTION

The present invention relates to a heat dissipating structure for an electronic control device (ECU).

FIG. 21 shows a conventional circuit board (i.e. printed circuit board) 110 which mounts electronic components 111 and is disposed in a casing of an electronic control device. The heat generated from a heat generating element 112 mounted on the circuit board 110 is transferred via a heat dissipation member 101 to a casing 100 as shown in FIG. 22. The heat dissipation member 101 is preferably used in an ECU of an automotive vehicle as a means for cooling the heat generating element 112 when the heat generating element 112 has high temperatures during its operation. The heat dissipation member 101 is usually an elastic substance represented by rubber or a resin adhesive or grease having improved heat dissipation properties. The heat dissipation member 101 is sandwiched between the casing 100 and the heat generating element 112 as shown in FIG. 22, or is sandwiched between the casing 100 and the circuit board 110 as shown in FIG. 23.

The heat generating element 112 used in this electronic control device is an element generating a great amount of heat in response to large current supplied thereto. Usually, a power MOS transistor or a power diode can be preferably used as the heat generating element 112. Meanwhile, recently developed SMD-type MOS transistors are excellent in compactness and operable under large currents and are accordingly preferably mountable on a circuit board of an electronic control device. In this respect, it is very important to enthusiastically continue engineering development activities for effectively cooling such compact electronic components with a smaller heat dissipating area. These electronic components have the capability of controlling other electronic components with large currents, and accordingly have an important role in the functions of ECU. Furthermore, these electronic components are decisive components which substantially determine the quality of product.

On the other hand, if a gel or other comparable material having fluidity is used as the heat dissipation member 101, although no cracks will occur when a stress is applied on the electronic control device, the heat dissipation member 101 will undesirably shift from a predetermined position when the heat dissipation member 101 or the casing 100 receives an external force such as shock or vibration. In other words, the heat dissipation member 101 will not be able to effectively show its heat dissipation properties.

In this respect, it is possible to increase the surface roughness of the casing as a method for preventing undesirably shifting of the heat dissipation member 101. However, completely suppressing the shifting of heat dissipation member 101 is difficult as long as the heat dissipation member 101 is made of a material having fluidity. Furthermore, as disclosed in the Japanese Patent Application Laid-open No. 2003-289191, as one of preferable embodiments, it is possible to provide a projection (i.e. dam) on a surface on which the heat dissipation member 101 is disposed. According to this method, the heat dissipation member 101 does not shift undesirably. However, this method requires specifying the layout of heat generating element 112 beforehand. When the circuit boards 110 to be handled have various layouts of heat generating element 112, it is necessary to prepare small quantity but many kinds of casings 100 for these circuit boards 110. The cost of casing 100 will increase.

SUMMARY OF THE INVENTION

In view of the above-described problems, the present invention has an object to provide an electronic control device capable of securing a heat dissipating path via a heat dissipation member and also capable of suppressing deterioration in heat dissipation properties even when the electronic control device is subjected to an external force, such as shock or vibration.

In order to accomplish the above and other related objects, the present invention provides a first electronic control device including, a circuit board accommodated in a casing to mount electronic components including at least one heat generating element, and a heat dissipation member having thermal conductivity and intervening between the heat generating element or the circuit board and an inner surface of the casing or a surface of a pedestal thermally bonded to the casing to provide thermal connection between the heat generating element and the casing. The heat dissipation member is a polymeric material having fluidity. And, a film for preventing a shifting of the heat dissipation member is disposed between the heat dissipation member and the inner surface of the casing or the surface of the pedestal. This shift preventing film is electrically or chemically bonded to the heat dissipation member and the casing or the pedestal.

According to the first electronic control device of the present invention, no cracks occur when a stress is applied on the electronic control device because the heat dissipation member is the polymeric material having fluidity. Furthermore, the shift preventing film can prevent the shifting of the heat dissipation member even when the heat dissipation member or the casing is subjected to an external force, such as shock or vibration, because the film is chemically or electrically bonded (i.e., detachable contact with a certain amount of bonding force) to the heat dissipation member and to the casing or the pedestal. Thus, the first electronic control device of the present invention can secure a heat dissipating path via the heat dissipation member and suppress deterioration in heat dissipation properties even when the external force, such as shock or vibration, is applied on the electronic control device.

Furthermore, to accomplish the above and other related objects, the present invention provides a second electronic control device including, a circuit board accommodated in a casing to mount electronic components including at least one heat generating element, and a heat dissipation member having thermal conductivity and intervening between the heat generating element or the circuit board and an inner surface of the casing or a surface of a pedestal thermally bonded to the casing to provide thermal connection between the heat generating element and the casing. The heat dissipation member is a polymeric material having fluidity. And, a film for preventing a shifting of the heat dissipation member is disposed between the heat dissipation member and the heat generating element or the circuit board. This shift preventing film is chemically or electrically bonded to the heat dissipation member and to the heat generating element or the circuit board.

According to the second electronic control device of the present invention, no cracks occur when a stress is applied on the electronic control device because the heat dissipation member is the polymeric material having fluidity or fluidity. Furthermore, the shift preventing film can prevent the shifting of the heat dissipation member even when the heat dissipation member or the casing is subjected to an external force, such as shock or vibration, because the shift preventing film is chemically or electrically bonded to the heat dissipation member and to the heat generating element or the circuit board. Thus, the second electronic control device of the present invention can secure a heat dissipating path via the heat dissipation member and suppress deterioration in heat dissipation properties even when the external force, such as shock or vibration, is applied on the electronic control device.

Furthermore, to accomplish the above and other related objects, the present invention provides a third electronic control device including, a circuit board accommodated in a casing to mount electronic components including at least one heat generating element, a heat dissipation member having thermal conductivity and intervening between the heat generating element or the circuit board and an inner surface of the casing or a surface of a pedestal thermally bonded to the casing to provide thermal connection between the heat generating element and the casing. The heat dissipation member is a polymeric material having fluidity. A first film for preventing a shifting of the heat dissipation member is disposed between the heat dissipation member and the inner surface of the casing or the surface of the pedestal. The first film is electrically or chemically bonded to the heat dissipation member and the casing or the pedestal. A second film for preventing a shifting of the heat dissipation member is disposed between the heat dissipation member and the heat generating element or the circuit board. The second film is chemically or electrically bonded to the heat dissipation member and to the heat generating element or the circuit board. According to the third electronic control device of the present invention, no cracks occur when a stress is applied on the electronic control device because the heat dissipation member is the polymeric material having fluidity. Furthermore, the first film can prevent the shifting of the heat dissipation member even when the heat dissipation member or the casing is subjected to an external force, such as shock or vibration, because the first film is chemically or electrically bonded to the heat dissipation member and to the casing or the pedestal. Furthermore, the second film can prevent the shifting of the heat dissipation member even when the heat dissipation member or the casing is subjected to an external force, such as shock or vibration, because the second film is chemically or electrically bonded to the heat dissipation member and to the heat generating element or the circuit board. Thus, the third electronic control device of the present invention can secure a heat dissipating path via the heat dissipation member and suppress deterioration in heat dissipation properties even when the external force, such as shock or vibration, is applied on the electronic control device.

According to the first or third electronic control device of the present invention, it is preferable that the film for preventing the shifting of the heat dissipation member is widely disposed on the inner surface of the casing or on the surface of the pedestal so as to entirely cover a portion where the heat generating element is mountable. The shift preventing film of the first or third electronic control device can be disposed at various portions on the casing or on the pedestal to prevent the shifting of the heat dissipation member. Thus, the first or third electronic control device of the present invention enables the same casing to be commonly used for a plurality of circuit boards differentiated in the layout of the heat generating element.

According to the first or third electronic control device of the present invention, it is preferable that the film for preventing the shifting of the heat dissipation member is narrowly disposed on the inner surface of the casing or on the surface of the pedestal so as to exclude a portion where no heat dissipation is required. The cost can be reduced.

According to any one of the first to third electronic control devices of the present invention, it is preferred that the heat dissipation member is made of a silicone-based resin material. This brings a preferable effect in the relationship with the above-described shift preventing film because the functional group of the silicone-based resin material can enhance the chemical bonding or electrical bonding properties.

According to any one of the first to third electronic control devices of the present invention, it is preferred that the heat dissipation member is made of an epoxy resin material. This brings a preferable effect in the relationship with the above-described shift preventing film because the functional group of the epoxy resin material can enhance the chemical bonding or electrical bonding properties.

According to the first or third electronic control device of the present invention, it is preferred that the casing or the pedestal is made of a metallic material. This brings a preferable effect in the relationship with the above-described shift preventing film because the hydroxyl group of the metallic material can enhance the chemical bonding or electrical bonding properties. Especially, when the casing or the pedestal is made of aluminum, a favorable effect will be obtained in the relationship with the above-described shift preventing film because the hydroxyl group of the aluminum material can enhance the chemical bonding or electrical bonding properties.

According to the first or third electronic control device of the present invention, it is preferred that at least a surface layer of the casing or the pedestal is constituted of a resin material. This brings a preferable effect in the relationship with the above-described shift preventing film because the functional group of the resin material can enhance the chemical bonding or electrical bonding properties.

According to any one of the first to third electronic control devices of the present invention, it is preferred that the film for preventing the shifting of the heat dissipation member is made of a material containing a benzene ring or a long hydrocarbon chain. The benzene ring can improve the high temperature properties of material, whereas the long hydrocarbon chain can improve the low temperature properties of material. In this way, the film having the above properties can be preferably provided as a film for preventing the shifting in an electronic control device installed in an automotive vehicle.

For the materials having the benzene ring and/or long hydrocarbon chain, mention is made of those high molecular weight alcohols or amines having a plurality of methyl groups, hydroxyl groups and/or benzene rings in the molecule. Alternatively, those materials having plural sulfonate groups may also be used in the practice of the invention.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to the attached drawings.

First Embodiment

Figure 1:
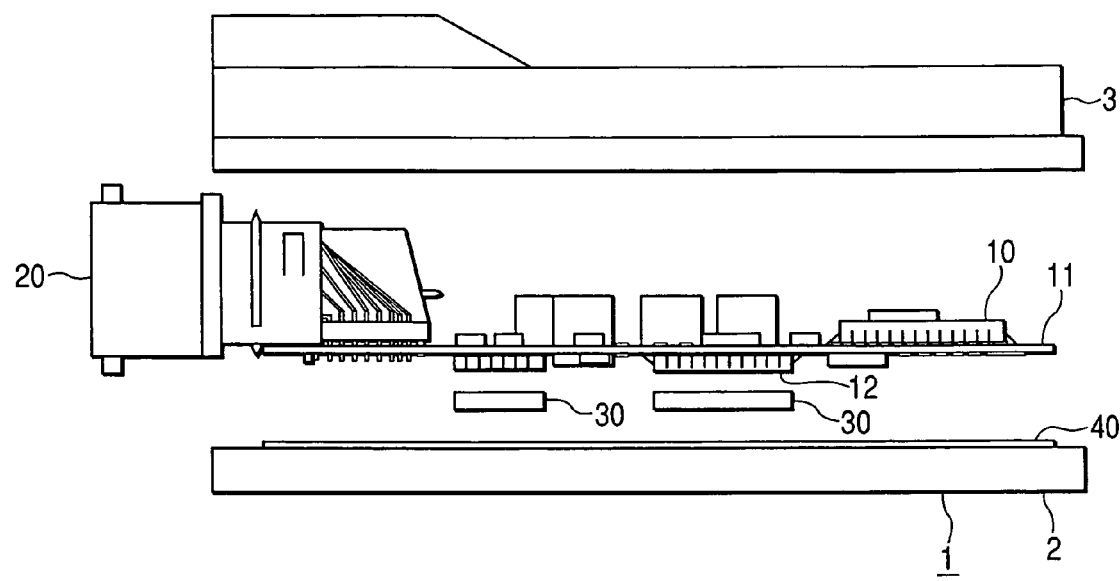
FIG. 1 is an exploded view showing an electronic control device in accordance with a first embodiment of the present invention.
Figure 2:
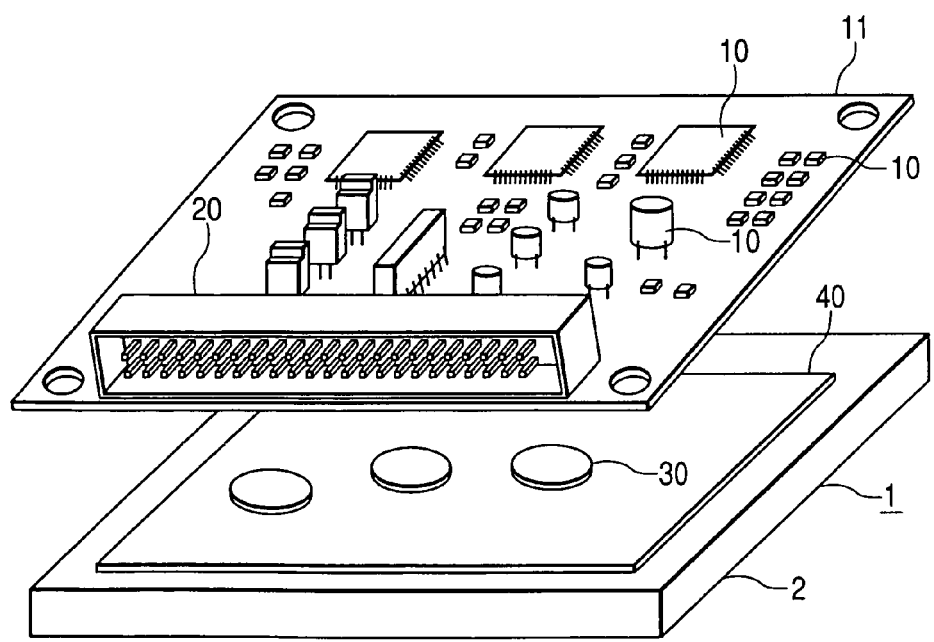
FIG. 2 is a perspective view showing the electronic control device in accordance with the first embodiment of the present invention.
Figure 3:
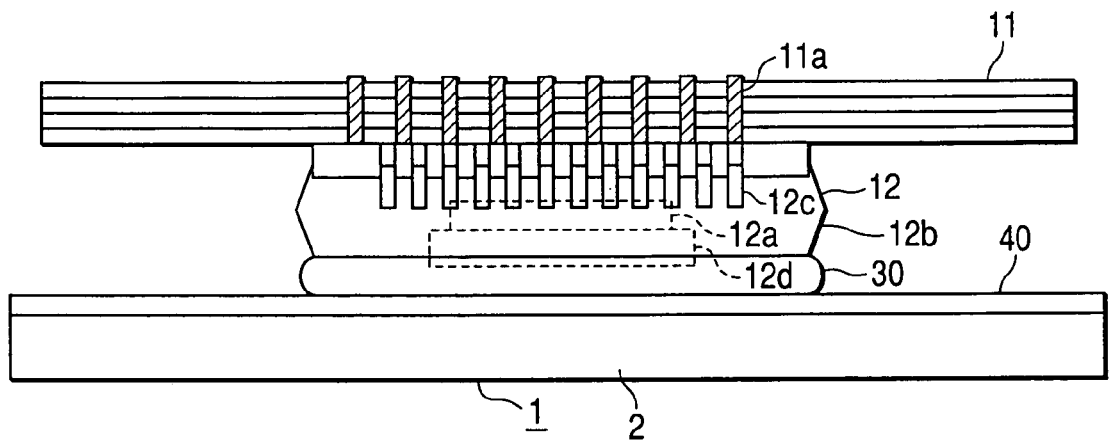
FIG. 3 is a vertical cross-sectional view showing a heat dissipating structure of a heat generating element mounted on a circuit board of the electronic control device in accordance with the first embodiment of the present invention.

Hereinafter, a first embodiment of the present invention will be explained with reference to attached drawings. FIG. 1 is an exploded view showing an electronic control device in accordance with the first embodiment of the present invention. FIG. 2 is a perspective view showing the electronic control device in accordance with the first embodiment, although an upper casing 3 shown in FIG. 1 is omitted. FIG. 3 is a vertical cross-sectional view showing a heat dissipating structure of an electronic component (i.e. a heat generating element) mounted on a circuit board of the electronic control device in accordance with the first embodiment. The electronic control device of this embodiment is an electronic control device installed in an automotive vehicle to control the engine, and in this respect can be referred to as engine control ECU.

A casing 1 consists of a lower casing 2 and an upper casing 3. The casing 1 (i.e. a combination of lower casing 2 and upper casing 3) is made of iron or aluminum. Alternatively, at least a surface of the casing 1 (i.e. a surface of lower casing 2 or upper casing 3) can be made of a resin material. More specifically, the casing can be entirely made of a resin. Alternatively, a resin coating may be applied on the surface of the metallic material. The lower casing 2 has a rectangular plate shape. The upper casing 3 has a rectangular box-like shape with an opened bottom. The lower casing 2 is arranged to close the bottom opening of the upper casing 3. The lower casing 2 and the upper casing 3 are tightened together by means of, for example, screws.

A circuit board 11 mounting a plurality of electronic components 10 is accommodated in the casing 1 so as to extend in the horizontal direction as shown. The electronic components 10 are soldered on upper or lower surfaces of the circuit board 11. The electronic components 10 include a heat generating element 12. The heat generating element 12 is disposed on a lower surface of the circuit board 11. The circuit board 11, as shown in FIG. 3, has a multilayered structure including insulating layers and conductive layers being alternately accumulated. Furthermore, the circuit board 11 has via-holes each extending vertically across the layers and filled with a conductor 11a. The circuit board 11 is made of a ceramic substrate or an epoxy substrate. The heat generating element 12 shown in FIG. 3 is a packaged component, which includes a chip 12a molded in a resin 12b and lead frames 12c protruding from the resin 12b. The lead frames 12c are soldered onto a conductive layer serving as a surface layer of the circuit board 11. The chip 12a includes power transistors, power diodes, and other components.

In this manner, the casing 1 accommodates the electronic components 10 including the heat generating element 12 mounted on the circuit board 11. Furthermore, a connector 20 is attached to the casing 1. The connector 20 has pins being electrically connectable with the circuit board 11. The electronic control device (i.e. the circuit board 11) is connected via the connector 20 and wires to external devices, such as a battery, various sensors, and engine control actuators. The electronic control device detects engine operating conditions based on sensor signals and executes various calculations to drive the actuators including injectors and igniters to optimize the engine operating conditions.

Furthermore, as shown in FIG. 3, a heat dissipation member 30 having thermal conductivity is sandwiched between the heat generating element 12 and an inner surface of the casing 1 (i.e. an upper surface of lower casing 2). The heat dissipation member 30 has a function of thermally bonding the heat generating element 12 and the casing 1. More specifically, the heat dissipation member 30 is formed of a gel substance containing a resin material serving as a base matrix and a metal oxide added thereto as a filler. The heat dissipation member 30 is made of a polymeric material having fluidity. Furthermore, a film 40 is disposed between the heat dissipation member 30 and the inner surface of the casing 1. This film 40 is chemically and/or electrically bonded to the heat dissipation member 30 and the casing 1, respectively. The film 40 serves to prevent the heat dissipation member 30 from shifting or moving in lateral directions. According to the arrangement of the heat generating element 12 shown in FIG. 3, the heat generated from the heat generating element 12 is transferred from the back surface of this element to the lower casing 2 via the heat dissipation member 30. To this end, a heat dissipation plate 12d for releasing the heat generated from the chip 12a is provided at the back surface of the heat generating element 12 (i.e. the surface facing to the lower casing 2). The heat dissipation plate 12d is brought into direct contact with the chip 12a and molded in the resin 12b. Furthermore, the heat dissipation plate 12d has one side (one surface) being exposed out of the resin 12b and brought into direct contact with the heat dissipation member 30 at the one side thereof.

In the present embodiment, a unit for dissipating heat from the heat generating element (i.e., heat-generating electric component included the in electronic components 10 is formed by comprising the casing 1, the heat dissipation member 30, and the shift preventing film 40.

Figure 4:
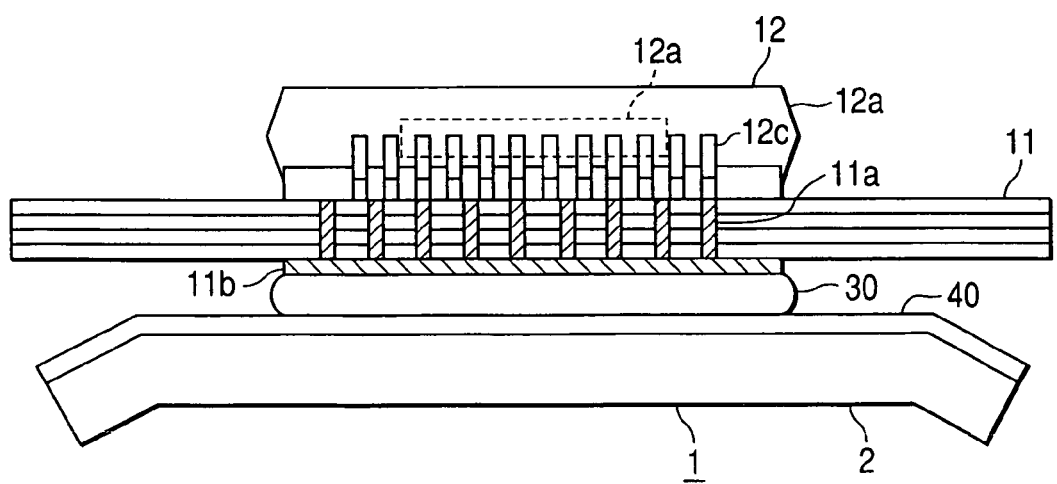
FIG. 4 is a vertical cross-sectional view showing a heat dissipating structure of the heat generating element mounted on the circuit board of the electronic control device in accordance with the first embodiment of the present invention.

Instead of using the structure shown in FIG. 3 wherein the heat is dissipated from the back surface of the element, it is possible to employ a heat dissipating structure of FIG. 4 which is characterized by an arrangement interposing the circuit board 11 between the heat generating element 12 and the heat dissipation member 30. More specifically, the heat dissipation member 30 having thermal conductivity is disposed between the circuit board 11 and the inner surface of the casing 1 (i.e. the upper surface of lower casing 2) to thermally bond the heat generating element 12 and the casing 1. The circuit board 11 has numerous via-holes formed at a region where the heat generating element 12 is disposed. Each via-hole is filled with the conductor 11a. The heat generated from the heat generating element 12 is easily transferred via the conductors 11a to the reverse face of the circuit board 11 (i.e. the lower surface shown in FIG. 4). Furthermore, a conductor pattern 11b is formed on the reverse surface of the circuit board 11 at least at a region where the heat dissipation member 30 is provided, so that the heat can be smoothly transferred to the heat dissipation member 30. However, the conductor pattern 11b may be omitted if the heat transfer is sufficiently attained without resorting thereto.

Further, the shift preventing film 40 shown in FIG. 3 is coated on the upper surface of the lower casing 2. The shift preventing film 40 has a thickness in the range from several μm to several tens of μm. Therefore, it becomes possible to reliably fix the heat dissipation member 30 on the shift preventing film 40 without extremely lowering the heat dissipating efficiency. If the thickness of the shift preventing film 40 is not within the range of several μm to several tens of μm, the heat dissipating efficiency would undesirably lower when the thickness is over the range, or uniform coating of the film 40 would be difficult when the thickness is below the above range.

Figure 5:
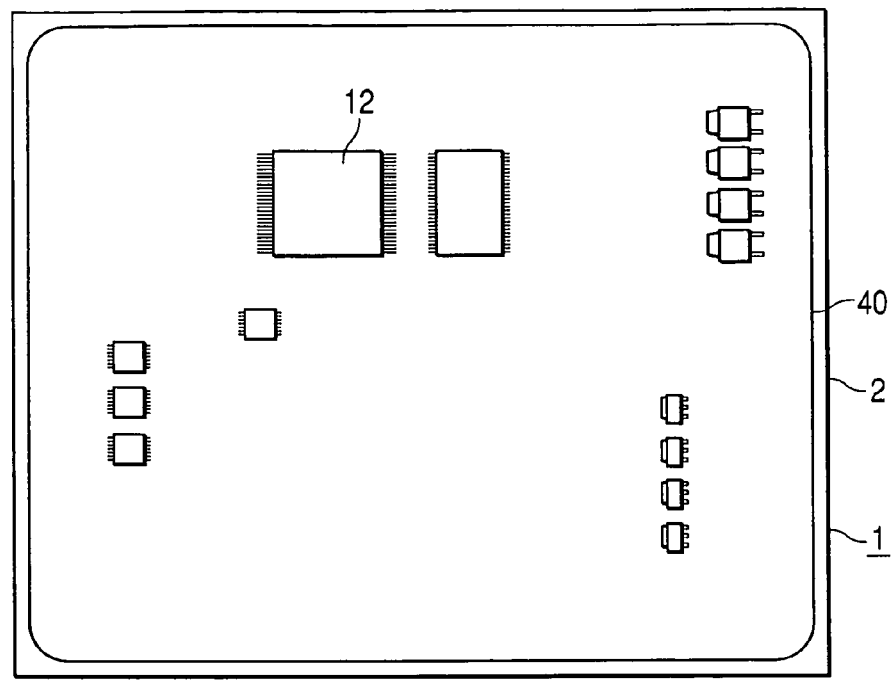
FIG. 5 is a plan view showing a lower casing of the electronic control device in accordance with the first embodiment of the present invention.

As shown in FIG. 5, the shift preventing film 40 extends entirely over the inner surface of the casing (more specifically, the upper surface of lower casing 2) where the heat generating element 12 (or the heat dissipation member 30) can be arranged or disposed. In other words, the shift preventing film 40 entirely covers the inner surface of casing 1 (i.e. the upper surface of lower casing 2), with which the heat dissipation member 30 is brought into contact. This arrangement brings the same fixing effect wherever the heat generating element 12 is positioned on the circuit board 11. In other words, this arrangement enables different types of electronic devices to use the common casing 1.

Figure 6:
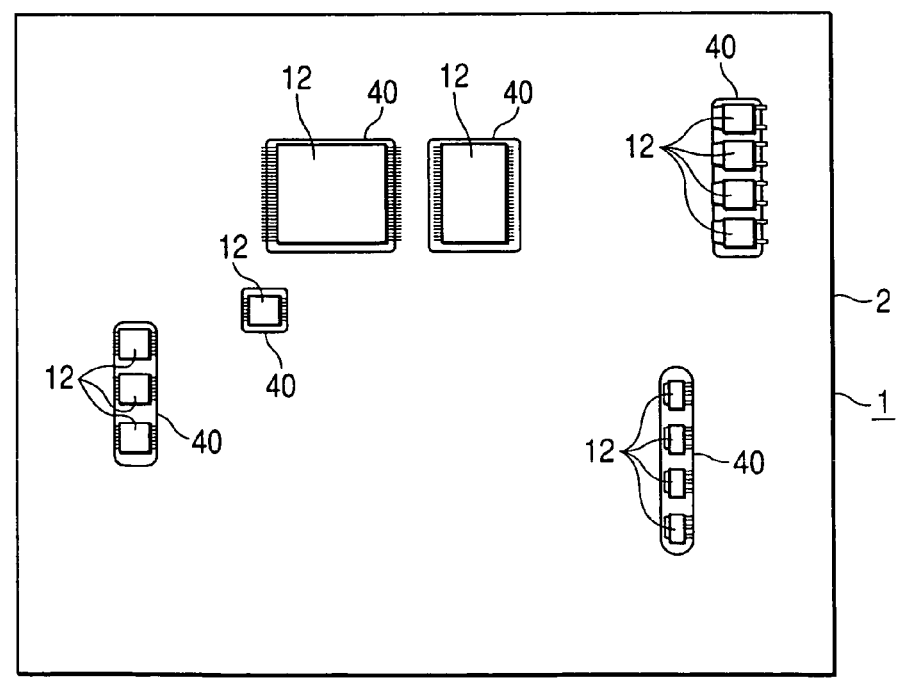
FIG. 6 is a plan view showing the lower casing of the electronic control device in accordance with the first embodiment of the present invention.

Furthermore, instead of using the arrangement shown in FIG. 5, it is possible to employ an arrangement of FIG. 6 according to which the shift preventing film 40 is provided partly on the inner surface of the casing (the upper surface of lower casing 2) and no shift preventing film 40 is provided at regions where no heat dissipation is required. Coating the shift preventing film 40 on the casing 1 as shown in FIG. 5 or FIG. 6 is advantageous in that, even after the design of the casing is accomplished, it is possible to flexibly modify or optimize the layout of the heat dissipation member 30 considering the position of each heat generating element 12 requiring sufficient heat dissipation properties. The design can be easily changed, and the cost for such changes is low. For example, after the evaluation of thermal properties of ECU, a heat dissipation member 30 is provided only for a heat generating element 12 requiring sufficient heat dissipation properties, thus leading to the reduction of development costs. In addition, the coating area of the shift preventing film 40 should be optimized considering the material cost and the facility depreciation cost in a comparison between the arrangement of FIG. 5 and the arrangement of FIG. 6. More specifically, when the cost of shift preventing film 40 is non-expensive compared with the depreciation cost for the partial coating facility, it is preferred to entirely coat the shift preventing film 40 over the inner surface of the casing (i.e. the upper surface of lower casing 2) as shown in FIG. 5. The heat generating element 12 (i.e. the heat dissipation member 30) can be disposed anywhere on the inner surface of the casing (i.e. the upper surface of lower casing 2) in this case. On the contrary, when the cost of shift preventing film 40 is expensive compared with the depreciation cost for the partial coating facility, it is preferred to limit the area of shift preventing film 40 as shown in FIG. 6 so that the heat dissipation member 30 is provided exclusively for each heat generating element 12 (i.e. heat dissipation member 30).

Figure 7:
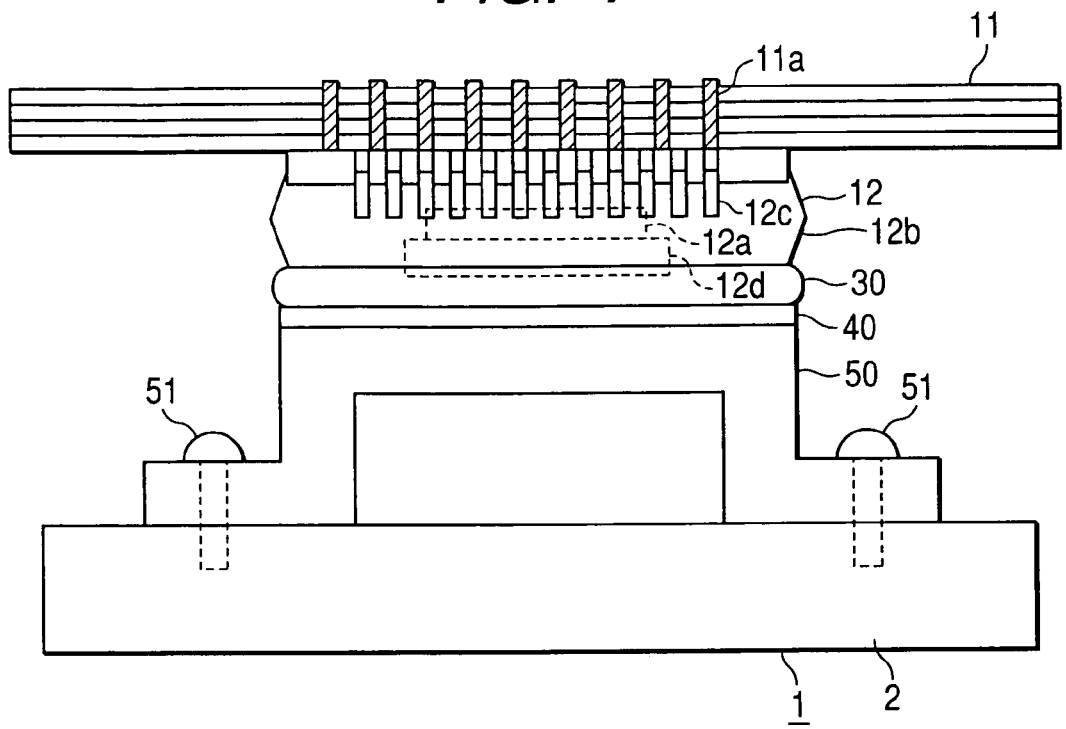
FIG. 7 is a vertical cross-sectional view showing another heat dissipating structure of the heat generating element mounted on the circuit board of the electronic control device in accordance with the first embodiment of the present invention.
Figure 8:
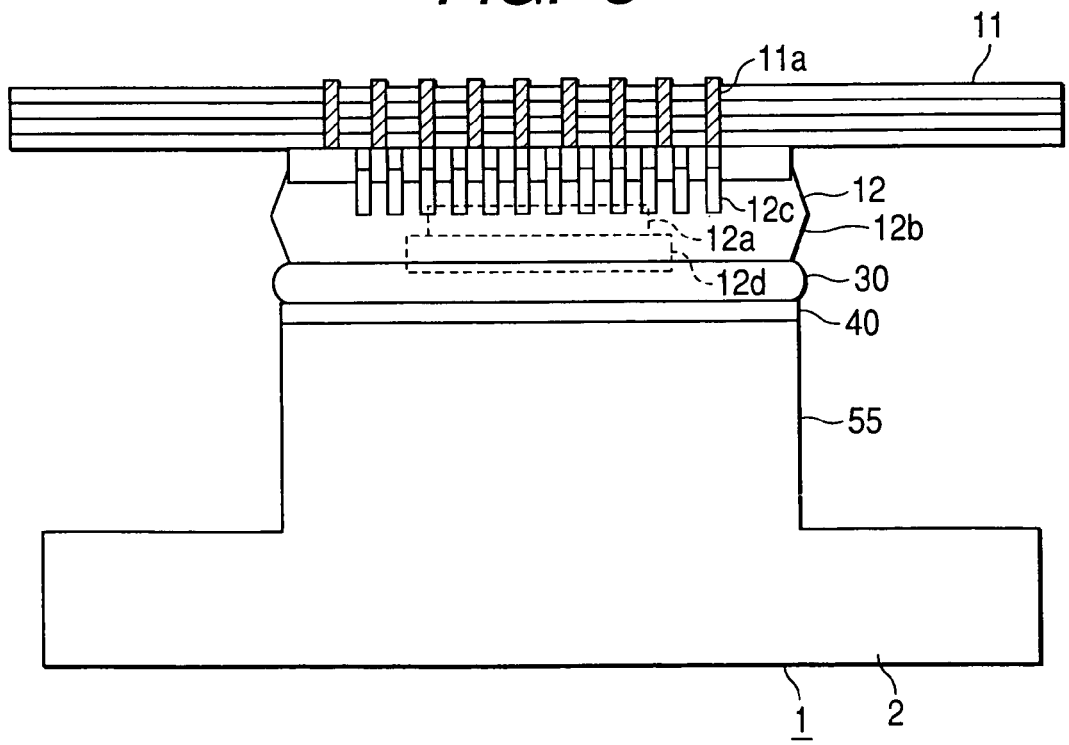
FIG. 8 is a vertical cross-sectional view showing another heat dissipating structure of the heat generating element mounted on the circuit board of the electronic control device in accordance with the first embodiment of the present invention.

Furthermore, instead of using the arrangement shown in FIG. 3, it is possible to employ an arrangement of FIG. 7 according to which the heat dissipation member 30 having thermal conductivity is disposed between the heat generating element 12 (or circuit board 11) and the surface of a pedestal 50 thermally bonded to the casing 1 and accordingly the heat generating element 12 and the casing 1 are thermally bonded with each other. More specifically, in the arrangement of FIG. 7, the pedestal 50 is fixed to the casing 1 by means of screws 51. The pedestal 50 is not limited to a separate part being formed independent of the casing 1. In this respect, the pedestal 50 can be formed integrally with the casing 1 as shown in FIG. 8. Namely, the casing 1 can be integrated at its inner surface with the pedestal 55.

Figure 9A:
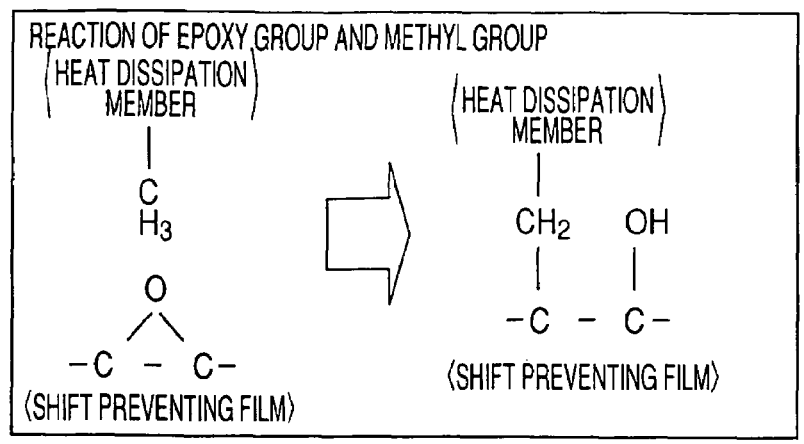
FIGS. 9A to 9D are explanatory views explaining chemical bonding between the heat dissipation member and a shift preventing film in accordance with the first embodiment of the present invention.
Figure 9B:
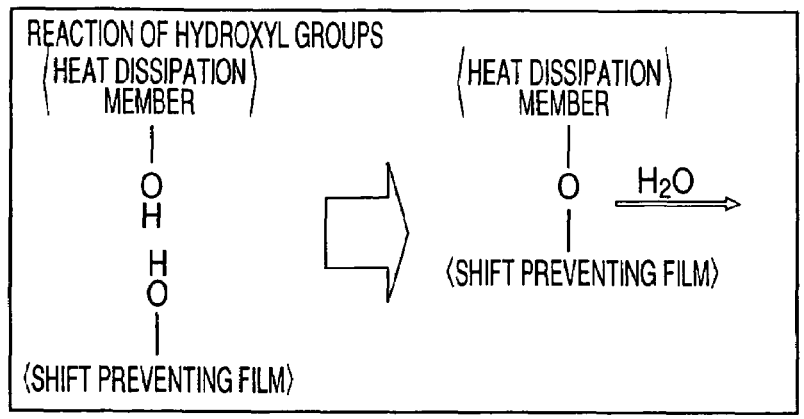
Figure 9C:
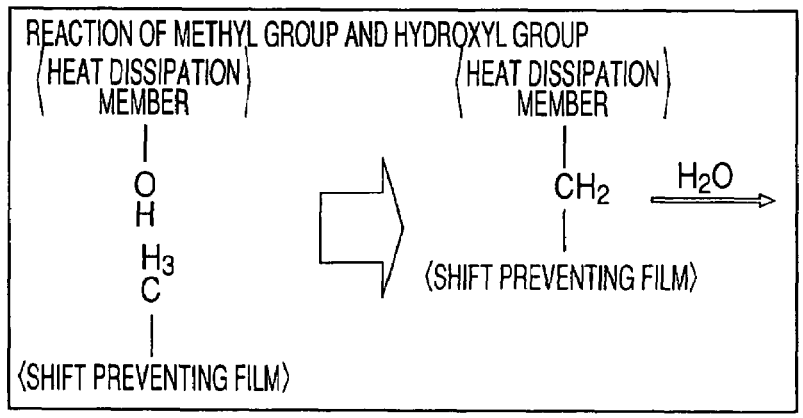
Figure 9D:
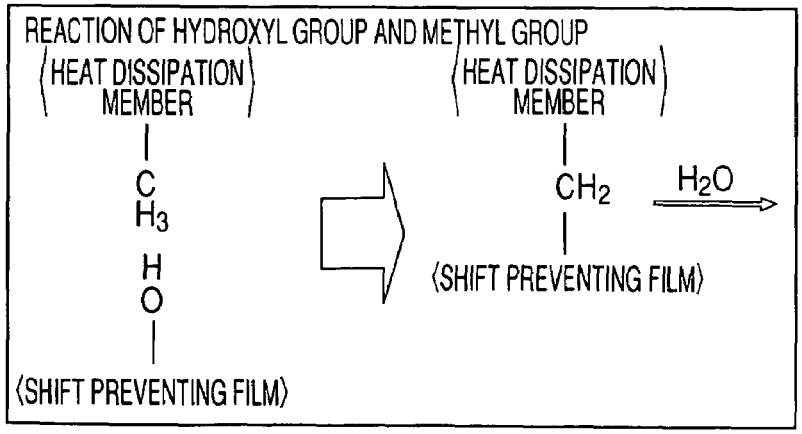
Figure 24A:
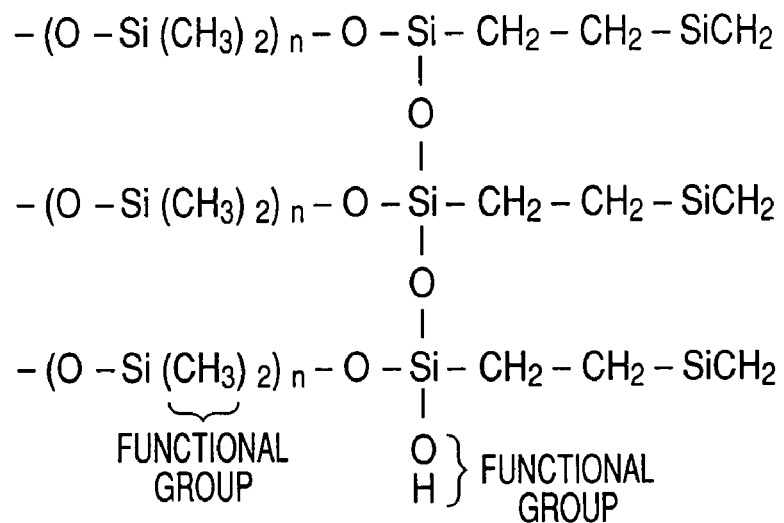
FIGS. 24A and 24B are views explaining the chemical structural formula of a silicone-based material and the chemical structural formula of an epoxy-based material.

Next, the explanation with respect to the chemical bonding between the shift preventing film 40 and the heat dissipation member 30 is given based on the arrangement shown in FIG. 3 according to which a silicone material (i.e. a silicone resin) is used for the heat dissipation member 30. As shown in FIG. 24A, the silicone-based material has a hydroxyl group and methyl groups as functional groups, or has the ether bonding. Hence, as shown in FIG. 9A, it is possible to form a covalent bonding of the heat dissipation member 30 and the shift preventing film 40 based on the ring-opening reaction occurring between the methyl group of the heat dissipation member 30 and the epoxy group of the shift preventing film 40. Alternatively, as shown in FIG. 9B, it is possible to form a covalent bonding of the heat dissipation member 30 and the shift preventing film 40 based on the dehydration reaction occurring between the hydroxyl group of the heat dissipation member 30 and the hydroxyl group of the shift preventing film 40. Furthermore, as shown in FIG. 9C, it is possible to form a covalent bonding of the heat dissipation member 30 and the shift preventing film 40 based on the dehydration reaction occurring between the hydroxyl group of the heat dissipation member 30 and the methyl group of the shift preventing film 40. Moreover, as shown in FIG. 9D, it is possible to form a covalent bonding of the heat dissipation member 30 and the shift preventing film 40 based on the dehydration reaction occurring between the methyl group of the heat dissipation member 30 and the hydroxyl group of the shift preventing film 40.

In this manner, the heat dissipation member (i.e. the silicone-based material) and the film 40 can be chemically bonded owing to the hydrogen bonding, intermolecular force bonding, ionic bonding, covalent bonding or the like through the condensation reaction or ring-opening reaction occurring between the functional groups (i.e. methyl group and hydroxyl group) of the heat dissipation member 30 and the functional group of the shift preventing film 40. In other words, the functional group of the silicone-based resin material is allowed to take part in the chemical bonding in the relationship between the heat dissipation member 30 and the shift preventing film 40.

Next, the explanation with respect to the chemical bonding between the shift preventing film 40 and the heat dissipation member 30 is given based on an arrangement using an epoxy-based material (i.e. an epoxy resin) for the heat dissipation member 30.

Figure 10A:
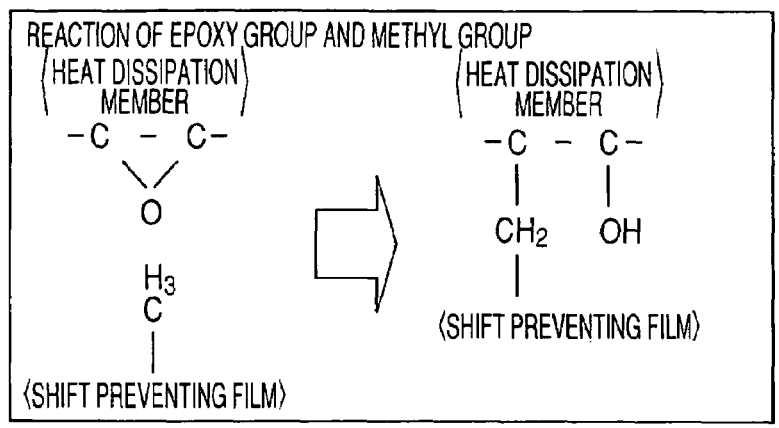
FIGS. 10A to 10D are explanatory views explaining chemical bonding between the heat dissipation member and the shift preventing film in accordance with the first embodiment of the present invention.
Figure 10B:
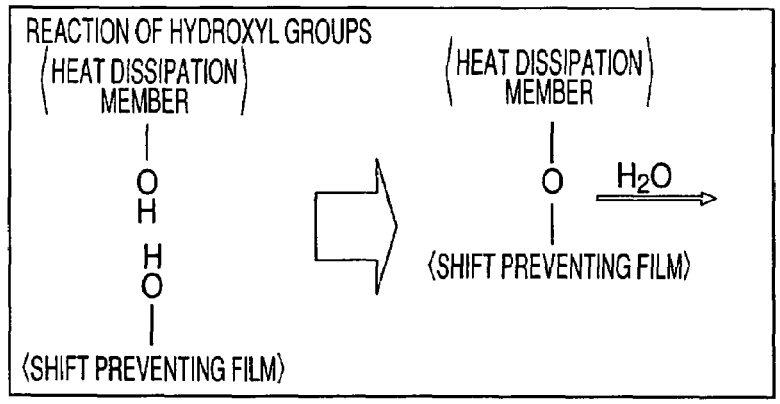
Figure 10C:
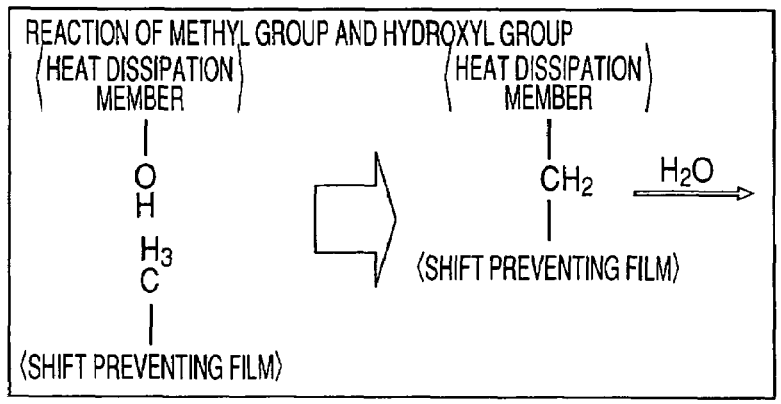
Figure 10D:
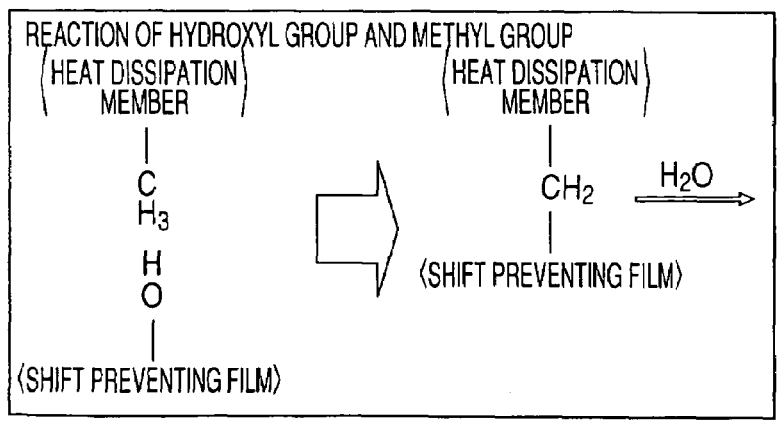
Figure 24B:
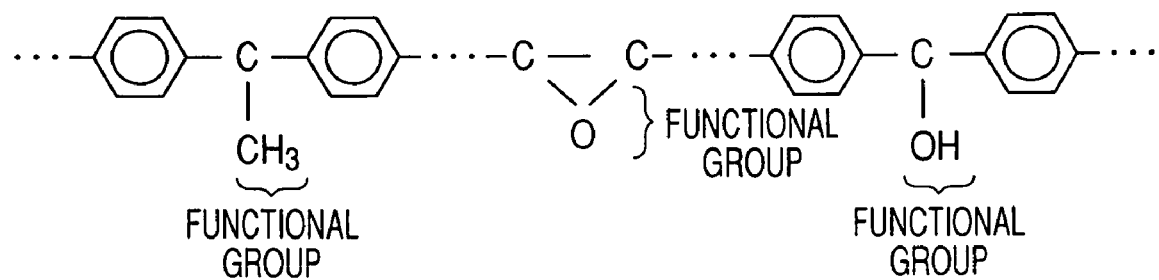

As shown in FIG. 24B, an epoxy-based material has, for example, a hydroxyl group, a methyl group, and an epoxy group as functional groups. Hence, as shown in FIG. 10A, it is possible to form a covalent bonding of the heat dissipation member 30 and the shift preventing film 40 based on the ring-opening reaction occurring between the epoxy group of the heat dissipation member 30 and the methyl group of the shift preventing film 40. Alternatively, as shown in FIG. 10B, it is possible to form a covalent bonding of the heat dissipation member 30 and the shift preventing film 40 based on the dehydration reaction occurring between the hydroxyl group of the heat dissipation member 30 and the hydroxyl group of the shift preventing film 40. Furthermore, as shown in FIG. 10C, it is possible to form a covalent bonding of the heat dissipation member 30 and the shift preventing film 40 based on the dehydration reaction occurring between the hydroxyl group of the heat dissipation member 30 and the methyl group of the shift preventing film 40. Moreover, as shown in FIG. 10D, it is possible to form a covalent bonding of the heat dissipation member 30 and the shift preventing film 40 based on the dehydration reaction occurring between the methyl group of the heat dissipation member 30 and the hydroxyl group of the shift preventing film 40.

In this manner, the hydrogen bonding, the intermolecular force bonding, the ionic bonding, the covalent bonding, or the like between the heat dissipation member (i.e. the epoxy-based material) and the film 40 can be formed by causing the condensation reaction or the ring-opening reaction occurring between the functional groups (i.e. methyl group, hydroxyl group, and epoxy group) of the heat dissipation member 30 and the functional group of the shift preventing film 40. In other words, the functional groups of the epoxy-based resin are allowed to take part in such chemical bonding as mentioned above in the relationship between the heat dissipation member 30 and the shift preventing film 40.

Next, explanation with respect to the electrical bonding force between the shift preventing film 40 and the heat dissipation member 30 is given based on an arrangement using such a silicone material as used for the heat dissipation member 30 with respect to FIG. 24A.

Figure 11A:
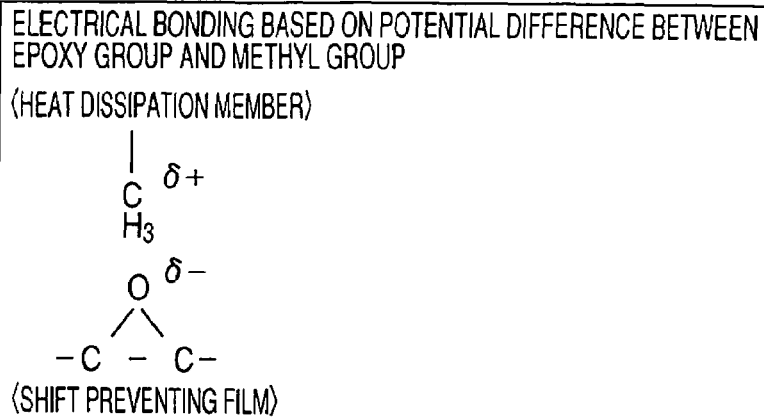
FIGS. 11A to 11D are explanatory views explaining electrical bonding between the heat dissipation member and the shift preventing film in accordance with the first embodiment of the present invention.
Figure 11B:
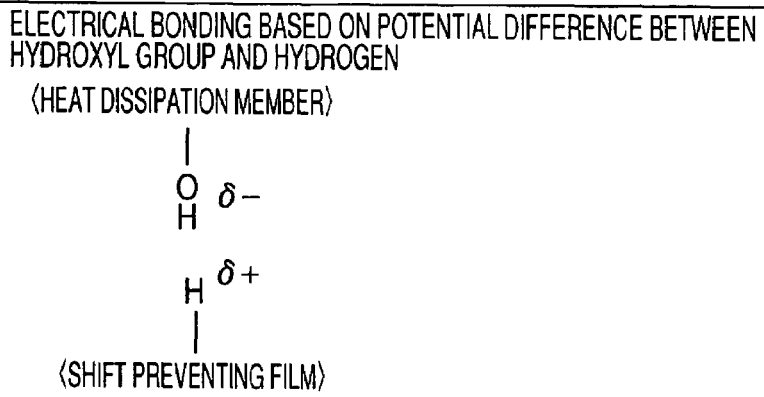
Figure 11C:
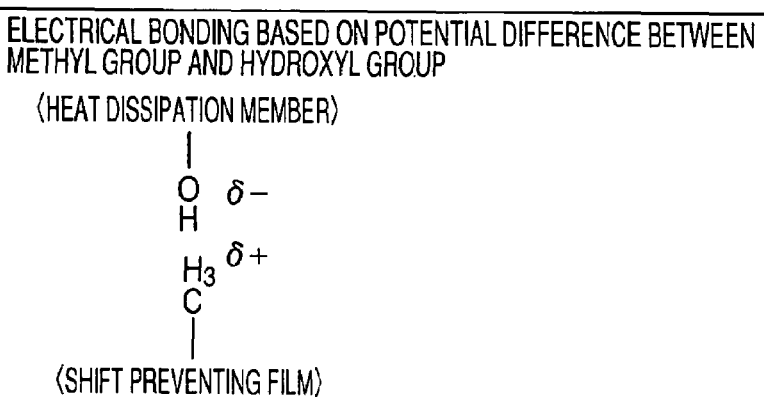
Figure 11D:
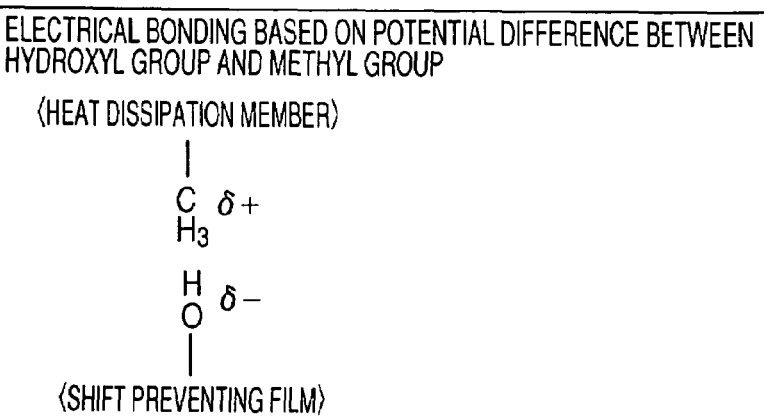

As described above, the silicone material has a hydroxyl group and methyl groups as functional groups, or has the ether bonding. Hence, as shown in FIG. 11A, it is possible to form electrical bonding of the heat dissipation member 30 and the shift preventing film 40 based on the deviation of electric charge existing between the methyl group of the heat dissipation member 30 and the epoxy group of the shift preventing film 40, i.e. between the methyl group positively charged as $\delta+$ and the epoxy group negatively charged as $\delta-$. Alternatively, as shown in FIG. 11B, it is possible to form electrical bonding between the heat dissipation member 30 and the shift preventing film 40 based on the deviation of electric charge existing between the hydroxyl group of the heat dissipation member 30 and the hydrogen of the shift preventing film 40, i.e. between the hydrogen atom of positive charge $\delta+$ and the hydroxyl group of negative charge $\delta-$. Furthermore, as shown in FIG. 11C, it is possible to form electrical bonding of the heat dissipation member 30 and the shift preventing film 40 based on the deviation of electric charge existing between the hydroxyl group of the heat dissipation member 30 and the methyl group of the shift preventing film 40, i.e. between the methyl group of positive charge $\delta+$ and the hydroxyl group of negative charge $\delta-$. Moreover, as shown in FIG. 11D, it is possible to form electrical bonding of the heat dissipation member 30 and the shift preventing film 40 based on the deviation of electric charge existing between the methyl group of the heat dissipation member 30 and the hydroxyl group of the shift preventing film 40, i.e. between the methyl group of positive charge $\delta+$ and the hydroxyl group of negative charge $\delta-$.

In this manner, the electrical bonding of the heat dissipation member and the film 40 can be formed through the deviation of electric charge existing between the functional group or groups (i.e. methyl group and hydroxyl group) of the heat dissipation member 30 and the functional group of the shift preventing film 40, i.e. between one type of functional group positively charged as δ+ and another type of function group negatively charged as δ−. In other words, the functional group or groups of the silicone resin are allowed to take part in the electrical bonding in the relationship between the heat dissipation member 30 and the shift preventing film 40, like the foregoing case of the chemical bonding.

Figure 12A:
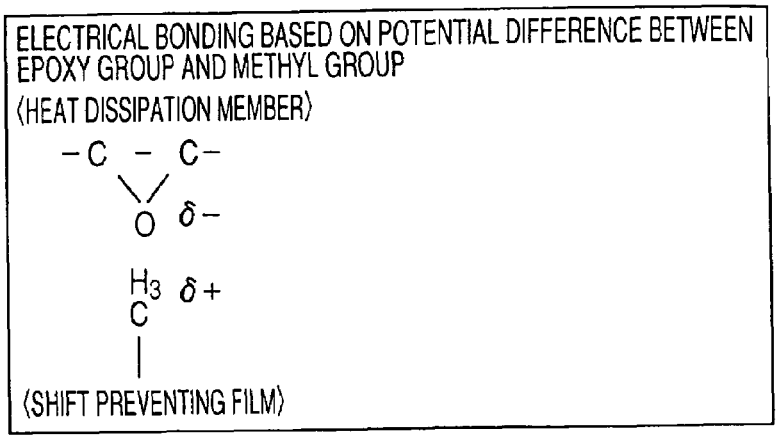
FIGS. 12A to 12D are explanatory views explaining electrical bonding between the heat dissipation member and the shift preventing film in accordance with the first embodiment of the present invention.
Figure 12B:
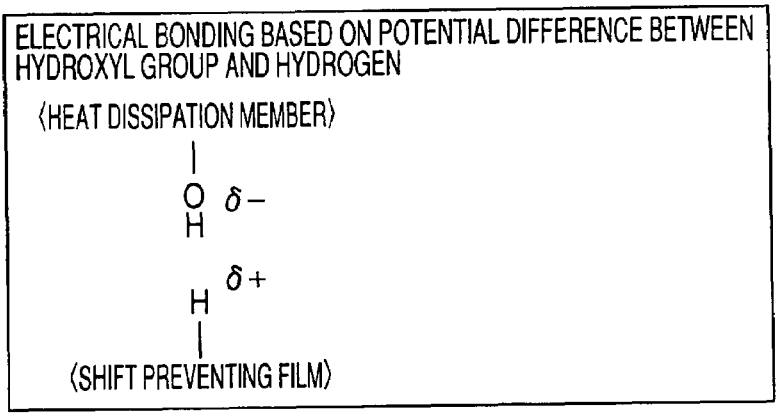
Figure 12C:
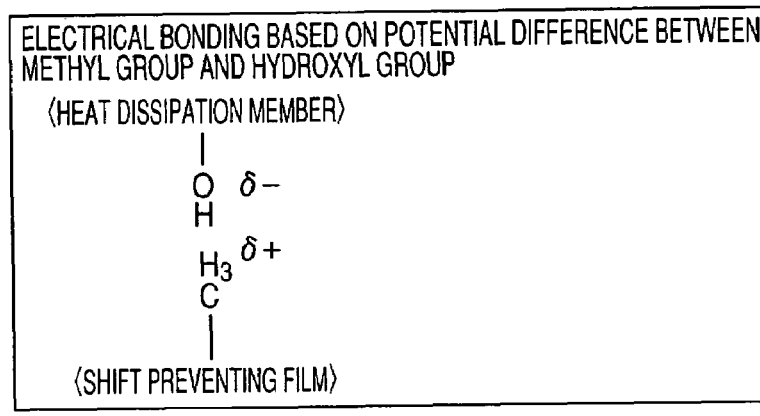
Figure 12D:
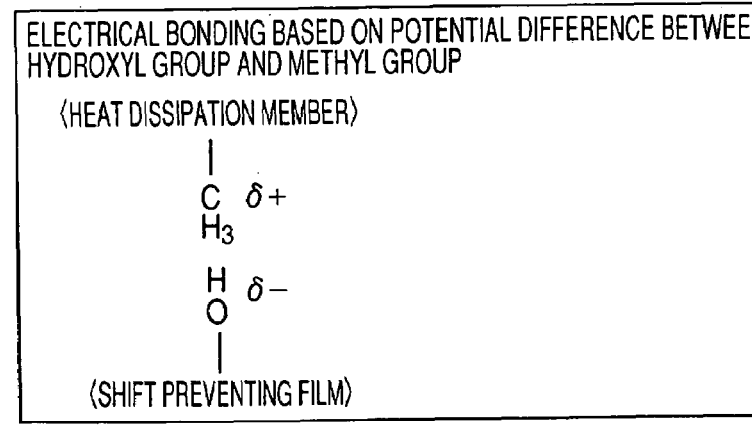

Next, the explanation with respect to the electrical bonding between the shift preventing film 40 and the heat dissipation member 30 is given based on an arrangement using the epoxy resin material for the heat dissipation member 30. As described above, the epoxy resin material has a hydroxyl group, a methyl group, and an epoxy group as functional groups. Hence, as shown in FIG. 12A, it is possible to form electrical bonding between the heat dissipation member 30 and the shift preventing film 40 based on the deviation of electric charge existing between the epoxy group of the heat dissipation member 30 and the methyl group of the shift preventing film 40, i.e. between the methyl group of positive charge δ+ and the epoxy group of negative charge δ−. Alternatively, as shown in FIG. 12B, it is possible to form electrical bonding between the heat dissipation member 30 and the shift preventing film 40 based on the deviation of electric charge existing between the hydroxyl group of the heat dissipation member 30 and the hydrogen of the shift preventing film 40, i.e. between the hydrogen atom of positive charge δ+ and the hydroxyl group of negative charge δ−. Furthermore, as shown in FIG. 12C, it is possible to form electrical bonding of the heat dissipation member 30 and the shift preventing film 40 based on the deviation of electric charge existing between the hydroxyl group of the heat dissipation member 30 and the methyl group of the shift preventing film 40, i.e. between the methyl group of positive charge δ+ and the hydroxyl group of negative charge δ−. Moreover, as shown in FIG. 12D, it is possible to form an electrical bonding of the heat dissipation member 30 and the shift preventing film 40 based on the deviation of electric charge existing between the methyl group of the heat dissipation member 30 and the hydroxyl group of the shift preventing film 40, i.e. between the methyl group of positive charge δ+ and the hydroxyl group of negative charge δ−.

In this manner, the electrical bonding of the heat dissipation member and the film 40 can be formed through the deviation of electric charge existing between the functional group or groups (i.e. methyl group, hydroxyl group, and epoxy group) of the heat dissipation member 30 and the functional group of the shift preventing film 40, i.e. between the functional group or groups of positive charge δ+ and the functional group of negative charge δ−. In other words, the functional group or groups of the epoxy resin material are allowed to take part in the electrical bonding in the relationship between the heat dissipation member 30 and the shift preventing film 40.

Figure 13A:
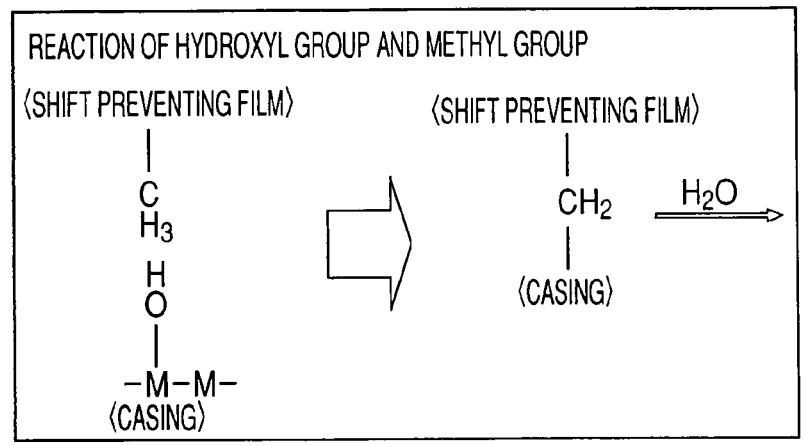
FIGS. 13A to 13C are explanatory views explaining chemical bonding between the shift preventing film and a casing in accordance with the first embodiment of the present invention.
Figure 13B:
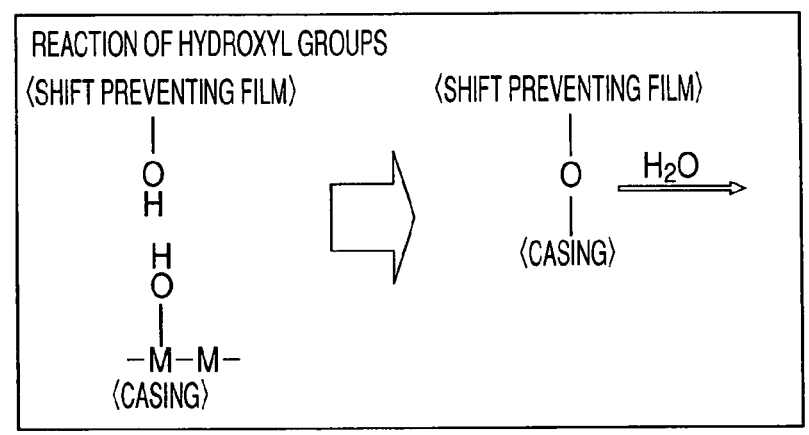
Figure 13C:
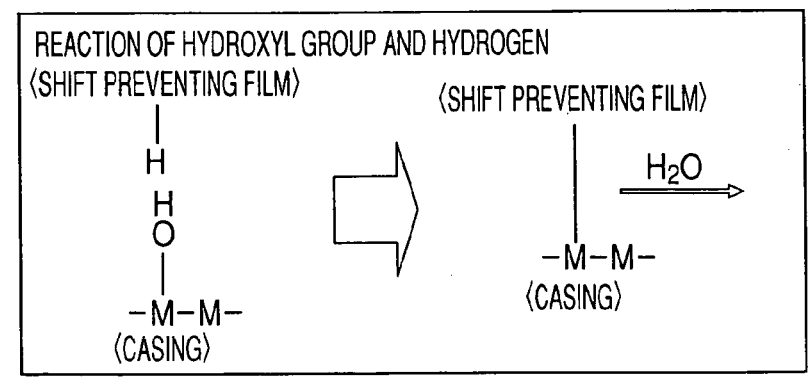

Next, explanation with respect to the chemically and/or electrical bonding of the shift preventing film 40 and the casing 1 is given based on an arrangement using a metallic material (e.g. aluminum) for the casing 1. As shown in FIG. 13A, a hydroxyl group is present on a metallic surface of the casing 1. Thus, it is possible to form covalent bonding between the shift preventing film 40 and the casing 1 based on the dehydration reaction occurring between the methyl group of the shift preventing film 40 and the hydroxyl group of the casing metal. Alternatively, as shown in FIG. 13B, it is possible to form a covalent bonding of the shift preventing film 40 and the casing 1 based on the dehydration reaction occurring between the hydroxyl group of the shift preventing film 40 and the hydroxyl group of the casing metal. Moreover, as shown in FIG. 13C, it is possible to form covalent bonding of the shift preventing film 40 and the casing 1 based on the dehydration reaction occurring between the hydrogen atom of the shift preventing film 40 and the hydroxyl group of the casing metal.

In this manner, the chemical bonding of the shift preventing film 40 and the casing 1 can be realized by utilizing the hydroxyl group, the methyl group, or the hydrogen of the shifting prevent film 40 and the hydroxyl group existing on the metallic surface of the casing. In other words, the hydroxyl group of the metallic material (e.g. aluminum) is allowed to take part in the chemical bonding in the relationship between the casing 1 and the shift preventing film 40.

Figure 14A:
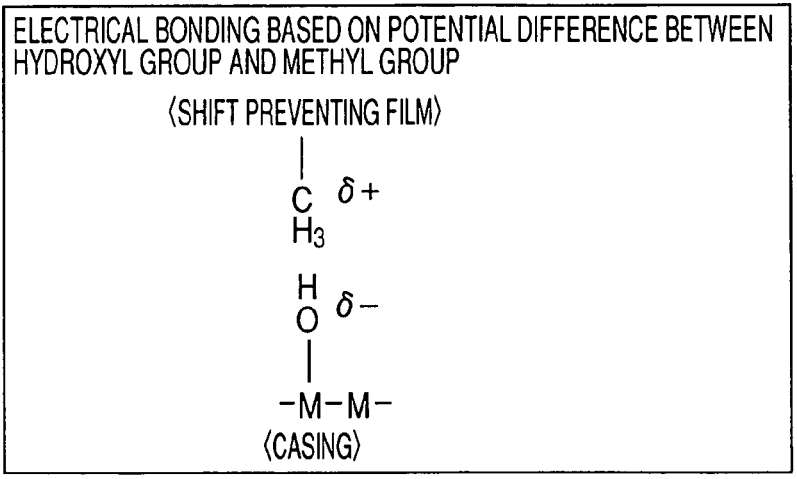
FIGS. 14A and 14B are explanatory views explaining electrical bonding between the shift preventing film and the casing in accordance with the first embodiment of the present invention.
Figure 14B:
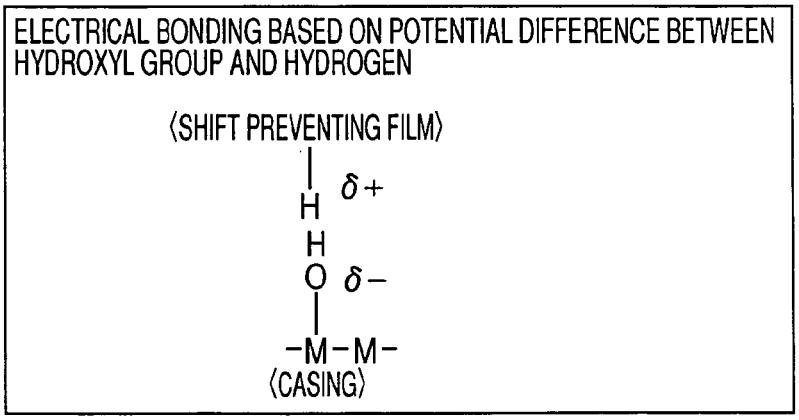

At the same time, as shown in FIG. 14A, it is possible to form electrical bonding of the shift preventing film 40 and the casing 1 based on the deviation of electric charge existing between the methyl group of the shift preventing film 40 and the hydroxyl group of the casing metal, i.e. between the methyl group positively charged as δ+ and the hydroxyl group negatively charged as δ−. Moreover, as shown in FIG. 14B, it is possible to form electrical bonding of the shift preventing film 40 and the casing 1 based on the deviation of electric charge existing between the hydrogen of the shift preventing film 40 and the hydroxyl group of the casing metal, i.e. between the hydrogen of positive charge δ+ and the hydroxyl group of negative charge δ−.

In this manner, the electrical bonding between the shift preventing film 40 and the casing 1 can be realized by utilizing the methyl group or the hydrogen atom of the shifting prevent film 40 and the hydroxyl group existing on the metallic surface of the casing. In other words, the hydroxyl group of the metallic material (e.g. aluminum) is allowed to take part in the electrical bonding in the relationship between the casing 1 and the shift preventing film 40.

Furthermore, in the case that the casing body is entirely formed with a resin or when a resin coating is applied onto a metallic surface of the casing, it is possible to form the chemical bonding and/or the electrical bonding between the shift preventing film 40 and the casing 1 through the functional group or groups appearing on the surface of the resin material. In other words, according to the arrangement using a resin material for forming at least a surface of the casing or the pedestal, the functional group or groups of the resin material are likewise allowed to take part in the chemical bonding or electrical bonding in the relationship between the casing 1 and the shift preventing film 40.

As will be apparent from the foregoing, the shift preventing film 40 used is designed to be higher in chemical reactivity with and/or electrical bonding to the heat dissipation member 30 and the casing 1 than in the chemical reactivity and/or electrical bonding between the heat dissipation member 30 and the casing 1, and thus, serves as a film for effectively preventing the movement or shifting of the heat dissipation member 30. In order to realize such a higher chemical or electrical bonding, the shift preventing film 40 is made of a material which exhibits a higher degree of deviation of positive or negative charge δ+ or − than a material for the heat dissipation member 30. In order to ensure such bonding characteristics of the shift preventing film 40, the material for the film 40 is so designed that at least an electron density is taken into account as one of parameters. More particularly, how the functional group or groups of a material for the shift preventing member 40 are electrically charged to realize electrical bonding or chemical bonding is important. For instance, in order to promote the chemical reaction between the functional groups of materials for the shift preventing member 40 and the casing 1 or heat dissipation member 30, the functional groups should be imparted with an energy exceeding a potential energy. Such an energy is provided with the electric charge of the material for the shift preventing member 40. In this sense, any materials capable of realizing chemical and/or electrical bonding with a material for the heat dissipation member 40 and/or the casing 1 may be used for the shift preventing member 40 while taking into account at least an electron density as a parameter for selection of a material for the member 40. In short, the materials for the member 40 should be so selected as having such functional groups capable of realizing the chemical and/or electrical bonding with a functional group of a material for the member 30 or casing 1 in a manner as depicted in FIG. 8A to FIG. 13C.

Figure 15:
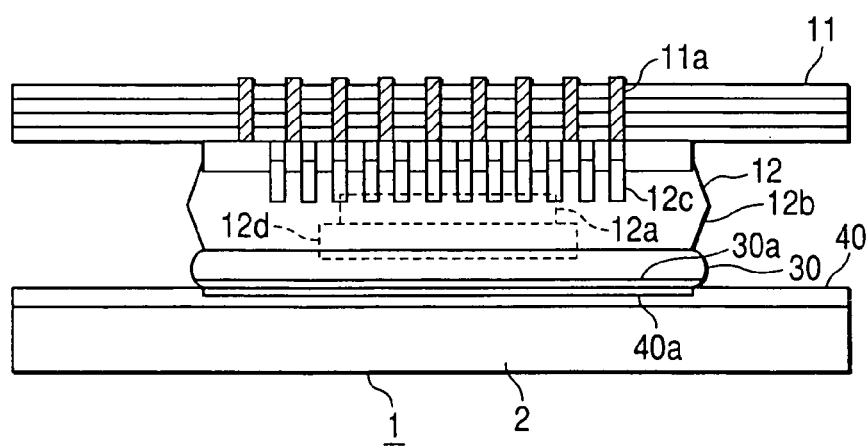
FIG. 15 is a vertical cross-sectional view showing another heat dissipating structure of the heat generating element mounted on the circuit board of the electronic control device in accordance with the first embodiment of the present invention.

Next, as shown in FIG. 15, an interface between the shift preventing film 40 and the heat dissipation member 30 may be hardened. More specifically, a surface layer 40a of shift preventing film 40 and a surface layer 30a of heat dissipation member 30 cooperatively form a hardened site. This hardened site can be formed by bringing the shift preventing film 40 and the heat dissipation member 30 into contact with each other and leaving them for a while. Alternatively, it is possible to heat them together to form the hardened site.

In this case, it is not favorable that the heat dissipation member 30 is hardened entirely along the thickness thereof. This is because the exfoliation or peeling may occur between the heat generating element 12 (or the circuit board 11) and the heat dissipation member 30 due to the difference in their linear expansion coefficients. However, no problem will arise when the difference between the linear expansion coefficients is small even if the heat dissipation member 30 is completely hardened.

When the electronic control device is installed in an automotive vehicle, especially in an engine room, the electronic control device is subjected to severe temperature environments. More specifically, the electronic control device is used in the temperature range from −40° C. to 150° C. According to usual design specification, the casing material used includes, for example, an aluminum alloy, iron, a resin-coated steel, a polyamide resin, a polybutylene terphthalate resin, or the like. It will be noted that if the electronic control device is mounted at a portion where the temperature conditions are not so severe, it will be possible to use polypropylene or other non-expensive materials for the casing. The base material of the heat dissipation member 30 includes a silicone resin or an epoxy resin as indicated hereinbefore.

Furthermore, examples of the material of the shift preventing film 40 suitable for the above heat dissipation member 30 include materials containing a long hydrocarbon chain with or without a benzene ring. Besides, those polymer materials having groups of a phenolic ring, OH, carboxyl, COOX wherein X represents an alkali metal, thiocarboxyl, sulfonate, amido, a hydroperoxide residue, or methyl may also be used.

Figure 16:
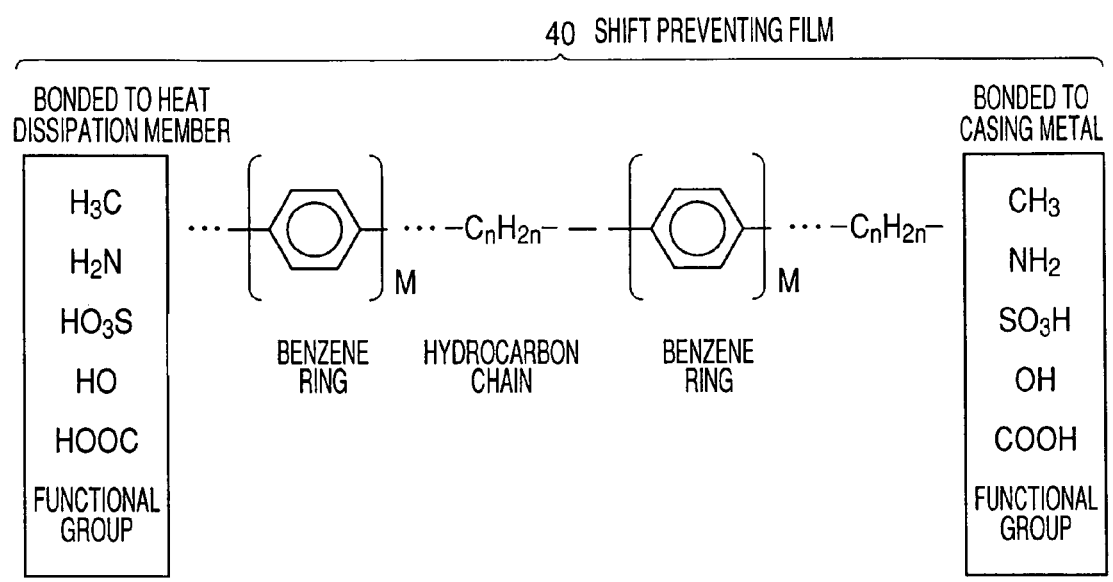
FIG. 16 is an explanatory view showing a structure of the shift preventing film in accordance with the first embodiment of the present invention.

To assure satisfactory durability of the shift preventing film 40 when used in a severe temperature environment (−40° C. to 150° C.) of an automotive vehicle, it is preferred to use a material having such a structure as shown in FIG. 16 although not limitative. In FIG. 16, the material is depicted as having a methyl group, an amino group, a sulfonate group, a hydroxyl group, and/or a carboxyl group as a functional group at a side where bonded to the heat dissipation member 30 and also at an opposite side where bonded to the casing metal, respectively. Furthermore, the material for the shift preventing film 40 contains benzene rings and hydrocarbon chains positioned between the terminal functional groups for connection with the heat dissipation member 30 and the other terminal functional groups for connection with the casing metal. In this case, to improve the low-temperature properties, it is preferred to extend the length of the hydrocarbon chain (i.e. n in the structure shown in FIG. 16 is increased) so as to prevent the shift preventing film 40 from becoming rigid or hardened in a low-temperature range. Furthermore, to improve the high-temperature properties, it is preferred that a larger number of benzene rings are placed in the backbone of the hydrocarbon chains (long molecular chains) so as to prevent the shift preventing film 40 from decomposing within a high-temperature range. In this manner, using a material bearing benzene rings and/or long hydrocarbon chains for the shift preventing film 40 brings the effect of improving the high-temperature material properties due to the presence of the benzene rings on one hand, and also brings the effect of improving the low-temperature material properties due to the presence of the tong hydrocarbon chains. Thus, the material having the structure shown in FIG. 16 can appropriately prevent undesirable shifting of the shift preventing film 40 even when it is used in a severe temperature environment of the automotive electronic control device.

The materials having benzene rings and/or long hydrocarbon chains (i.e. materials having preferred structures for the shift preventing film 40) include, for example, polymer materials having long hydrocarbon chains bearing methyl groups and alcoholic OH groups, and benzene rings in the molecule, polymer materials having long hydrocarbon chains bearing methyl groups and amino groups, and benzene rings, polymer materials having long hydrocarbon chains bearing methyl groups and epoxy groups, and benzene rings, polymer materials having long hydrocarbon chains bearing methyl groups and sulfonate groups, and benzene rings, and polymer materials having long hydrocarbon groups bearing ethyl groups and alcoholic OH groups, and benzene rings.

These polymer materials can be prepared, for example, from those compounds or materials including proline, phenylalanine, antipain, chymostatin, bestatin, kynurenine, tyrosine, methylhydroxyquinoline, sulfamethizole, or tyramine.

The electronic control unit including the shift preventing film 40 according to the invention may be made in the following way. The shift preventing film 40 should be formed by a procedure capable of controlling the thickness of the film 4. A liquid composition comprising a polymer material as set out above is applied, for example, onto a lower casing according to brushing, dipping, spraying, spinning or the like in such a thickness as indicated hereinbefore. The thickness is determined depending on the required heat release characteristic that is, in turn, determined from heat generating from a heat generating element. If a higher heat release characteristic is required, the film-forming procedure as mentioned above is appropriately selected in the mentioned order.

Thereafter, a heat dissipation member is coated onto the shift preventing film. The thickness of the heat dissipation member is determined depending on the assembling tolerance, so that a coating procedure not requiring any thickness control like the shift preventing film may be used for this coating. Next, a circuit board is mounted on the heat dissipation member, followed by fixing an upper case to complete the electronic control unit.

As described hereinabove, this embodiment has the following features. As shown in FIGS. 3 and 7, this embodiment provides a first electronic control unit or device including the circuit board 11 accommodated in the casing 1 to mount electronic components 10 including at least one heat generating element 12. The heat dissipation member 30 having thermal conductivity intervenes between the heat generating element 12 or the circuit board 11 and the casing 1 or a surface of the pedestal 50 thermally bonded to an inner surface of the casing 1, thereby providing thermal connection between the heat generating element 12 and the casing 1. According to the above-described first electronic control device, the heat dissipation member 30 is made of a polymeric material having fluidity. The film 40 for preventing shifting or moving of the heat dissipation member 30 is disposed between the heat dissipation member 30 and the inner surface of the casing 1 or the surface of the pedestal 50. The film 40 is electrically and/or chemically bonded to the heat dissipation member 30 and also to the casing 1 or the pedestal 50. According to the first electronic control device of this embodiment, no cracks occur when a stress is applied onto the electronic control device because the heat dissipation member 30 is formed of the polymeric material having fluidity. Furthermore, the film 40 can prevent the shifting of the heat dissipation member 30 even when the heat dissipation member 30 or the casing 1 is subjected to a load of shock or vibration, or an external force caused by temperature cycle or gravity, because the film 40 is chemically or electrically bonded to the heat dissipation member 30 and to the casing 1 or the pedestal 50. Thus, the first electronic control device of this embodiment can secure a heat dissipating path via the heat dissipation member 30 and suppress deterioration in heat dissipation properties even when the external force, such as shock or vibration, is applied onto the electronic control device.

Furthermore, as shown in FIG. 5 the film 40 for preventing the shifting of the heat dissipation member 30 is disposed on the inner surface of the casing 1 or on the surface of the pedestal 50 so as to entirely cover a portion where the heat generating element 12 is mountable. The film 40 for preventing the shifting of the heat dissipation member 30 can be widely disposed at various portions on the casing 1 or on the pedestal 50 to prevent the shifting of the heat dissipation member 30. Thus, the electronic control device of this embodiment enables the same casing 1 to be commonly used for a plurality kinds of circuit boards (i.e. printed circuit boards) 11 differentiated in the layout of the heat generating element 12. Thus, not only the cost of the electronic control device can be greatly reduced but also the casing 1 can possess the capability of assuring highly efficient heat dissipation properties.

Alternatively, as shown in FIG. 6, the film 40 for preventing the shifting of the heat dissipation member 30 can be narrowly disposed on the inner surface of the casing 1 or on the surface of the pedestal 50 so as to exclude a portion where no heat dissipation is required. The cost can be reduced.

Second Embodiment

Next, an electronic control device in accordance with a second embodiment is explained with reference to FIGS. 17 and 18. The electronic control device of the second embodiment differs from the electronic control device of the first embodiment in the following points.

Figure 17:
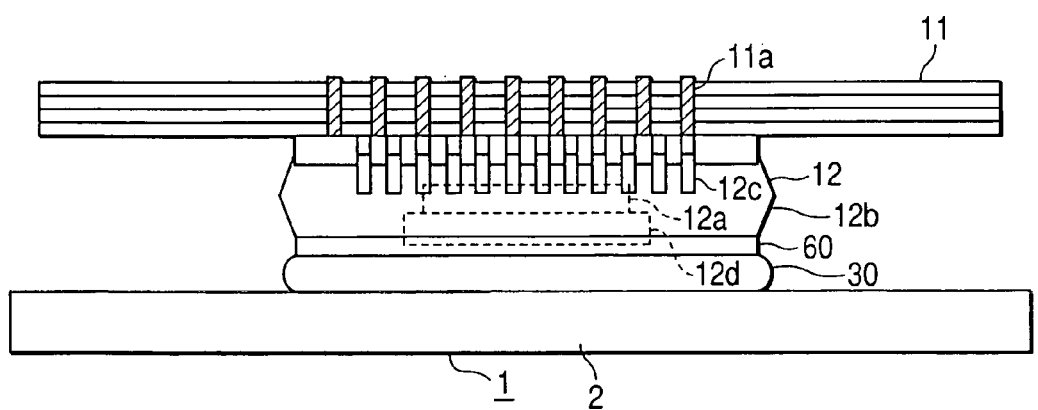
FIG. 17 is a vertical cross-sectional view showing a heat dissipating structure of a heat generating element in accordance with a second embodiment of the present invention.

FIG. 17 shows a heat dissipating structure of the second embodiment which is replaceable with the heat dissipating structure shown in FIG. 3. The above-described first embodiment, as shown in FIGS. 3 and 7, is characterized in that the film 40 having the capability of preventing the shifting of heat dissipation member 30 is disposed between the heat dissipation member 30 and the inner surface of casing 1 or the surface of pedestal 50. The heat dissipation member 30 and the casing 1 or the pedestal 50 are chemically and/or electrically bonded together. On the contrary, the arrangement of the second embodiment shown in FIG. 17 is characterized in that a film 60 having the capability of preventing the shifting of heat dissipation member 30 is disposed between the heat dissipation member 30 and the heat generating element 12. The heat dissipation member 30 and the heat generating element 12 are chemically and/or electrically bonded together. The film 60 used in the second embodiment is similar to the shift preventing film 40 of the first embodiment. As shown in FIG. 17, the shift preventing film 60 is connected to the mold resin 12b and the heat dissipation plate 12d (i.e. metal plate) in the heat generating element 12.

Thus, this embodiment provides a second electronic control device, including the circuit board 11 accommodated in the casing 1 to mount electronic components 10 including at least one heat generating element 12, the heat dissipation member 30 having thermal conductivity and intervening between the heat generating element 12 and the inner surface of the casing 1 (or the surface of pedestal 50) to provide thermal connection between the heat generating element 12 and the casing 1. According to the above second electronic control device, the heat dissipation member 30 is a polymeric material having fluidity. The film 60 for preventing a shifting of the heat dissipation member 30 is disposed between the heat dissipation member 30 and the heat generating element 12. The film 60 is chemically and/or electrically bonded to the heat dissipation member 30 and to the heat generating element 12 in a manner as set forth with respect to the first embodiment. According to the second electronic control device of this embodiment, no cracks occur when a stress is applied on the electronic control device because the heat dissipation member 30 is made of the polymeric material having fluidity. Furthermore, the film 60 can prevent the shifting of the heat dissipation member 30 even when the heat dissipation member 30 or the casing 1 is subjected to an external force, such as shock or vibration, because the film 60 is chemically or electrically bonded to the heat dissipation member 30 and to the heat generating element 12. Thus, the second electronic control device of this embodiment can secure a heat dissipating path via the heat dissipation member 30 and suppress deterioration in heat dissipation properties even when the external force, such as shock or vibration, is applied on the electronic control device.

Figure 18:
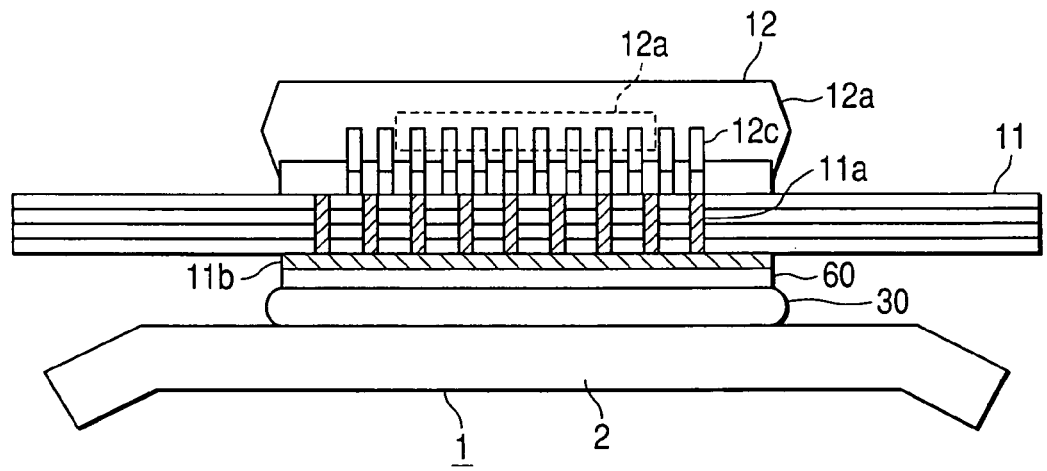
FIG. 18 is a vertical cross-sectional view showing another heat dissipating structure of the heat generating element in accordance with the second embodiment of the present invention.

Although FIG. 17 shows the arrangement disposing the shift preventing film 60 between the heat dissipation member 30 and the heat generating element 12, it is possible to employ an arrangement shown in FIG. 18 which is characterized in that the shift preventing film 60 is disposed between the heat dissipation member 30 and the circuit board 11. More specifically, FIG. 18 shows a heat dissipating structure of the second embodiment which is replaceable with the heat dissipating structure shown in FIG. 4. As shown in FIG. 18, the film 60 is disposed between the heat dissipation member 30 and the circuit board 11. The film 60 is chemically or electrically bonded to the heat dissipation member 30 and to the circuit board 11 and accordingly has the capability of preventing a shifting of the heat dissipation member 30.

Thus, this embodiment provides another aspect of the second electronic control device including the circuit board 11 accommodated in the casing 1 to mount electronic components 10 including at least one heat generating element 12. The heat dissipation member 30 having thermal conductivity intervenes between the circuit board 11 and the inner surface of the casing 1 (or the surface of pedestal 50) to provide thermal connection between the heat generating element 12 and the casing 1. According to this electronic control device, the heat dissipation member 30 is a polymeric material having fluidity. The film 60 for preventing a shifting of the heat dissipation member 30 is disposed between the heat dissipation member 30 and the circuit board 11. The film 60 is chemically or electrically bonded to the heat dissipation member 30 and to the circuit board 11. According to the electronic control device of this embodiment, no cracks occur when a stress is applied on the electronic control device because the heat dissipation member 30 is made of the polymeric material having fluidity. Furthermore, the film 60 can prevent the shifting of the heat dissipation member 30 even when the heat dissipation member 30 or the casing 1 is subjected to an external force, such as shock or vibration, because the film 60 is chemically or electrically bonded to the heat dissipation member 30 and to the circuit board 11. Thus, the second electronic control device of this embodiment can secure a heat dissipating path via the heat dissipation member 30 and suppress deterioration in heat dissipation properties even when the external force, such as shock or vibration, is applied on the electronic control device. The electronic control device shown in FIG. 18 brings substantially the same functions and effects as those of the electronic control device shown in FIG. 17. Although FIG. 18 shows a conductor pattern 11b (i.e. metal) of the circuit board 11 via which the shift preventing film 60 is brought into contact with the circuit board 11, it is possible to omit the conductor pattern 11b when the shift preventing film 60 is brought into contact with an insulating layer (i.e. resin) of the circuit board 11.

Third Embodiment

Next, an electronic control device in accordance with a third embodiment will be explained with reference to FIGS. 19 and 20. The electronic control device of the third embodiment differs from the electronic control device of the first or second embodiment in the following points.

Figure 19:
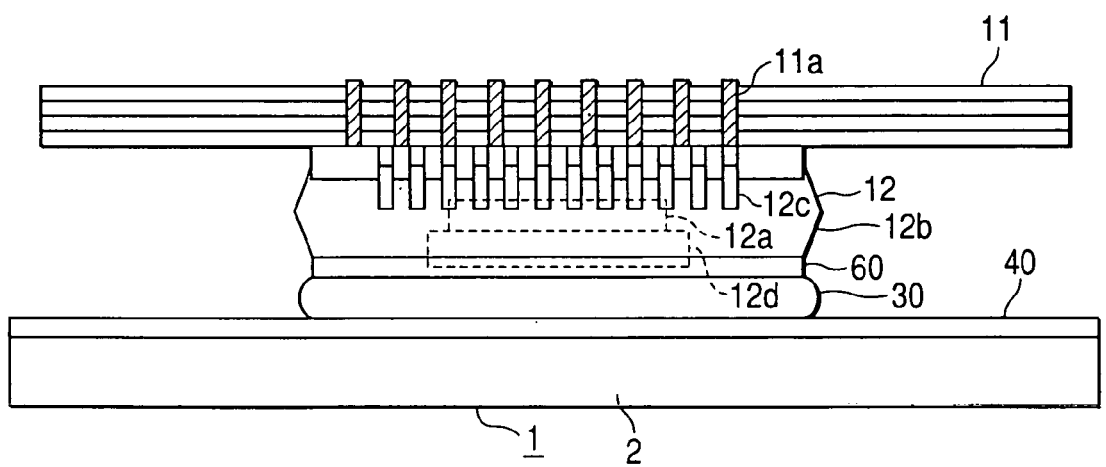
FIG. 19 is a vertical cross-sectional view showing a heat dissipating structure of a heat generating element in accordance with a third embodiment of the present invention.

FIG. 19 shows a heat dissipating structure according to the third embodiment. The heat dissipating structure of the third embodiment is substantially a combination of the arrangement of the second embodiment shown in FIG. 17 (i.e. the arrangement including the shift preventing film 60) and the arrangement of the first embodiment shown in FIG. 3 (i.e. arrangement including the shift preventing film 40). More specifically, as apparent from FIG. 19, one shift preventing film 40 is disposed between the heat dissipation member 30 and the inner surface of the casing 1 (or surface of the pedestal 50) and another shift preventing film 60 is disposed between the heat dissipation member 30 and the heat generating element 12. The third embodiment of the present invention not only brings the functions and effects of the shift preventing film 40 (i.e. the functions and effects of the first embodiment) and the functions and effects of the shift preventing film 60 (i.e. the functions and effects of the second embodiment). As a result, the third embodiment can surely prevent the heat dissipation member 30 from undesirably shifting.

More specifically, the third embodiment of the present invention provides a third electronic control device including the circuit board 11 accommodated in the casing 1 to mount electronic components 10 including at least one heat generating element 12. The heat dissipation member 30 having thermal conductivity intervenes between the heat generating element 12 (or the circuit board 11) and the inner surface of the casing 1 (or the surface of the pedestal 50 thermally bonded to the casing 1), thereby providing thermal connection between the heat generating element 12 and the casing 1. According to the third electronic control device of this embodiment, the heat dissipation member 30 is a polymeric material having fluidity. The first film 40 for preventing a shifting of the heat dissipation member 30 is disposed between the heat dissipation member 30 and the inner surface of the casing 1 (or the surface of the pedestal 50). The first film 40 is electrically and/or chemically bonded to the heat dissipation member 30 and to the casing 1 (or the pedestal 50). And, the second film 60 for preventing a shifting of the heat dissipation member 30 is disposed between the heat dissipation member 30 and the heat generating element 12. The second film 60 is chemically or electrically bonded to the heat dissipation member 30 and to the heat generating element 12. Thus, according to the third electronic control device of this embodiment, no cracks occur when a stress is applied on the electronic control device because the heat dissipation member 30 is the polymeric material having fluidity. Furthermore, the first film 40 can prevent the shifting of the heat dissipation member 30 even when the heat dissipation member 30 or the casing 1 is subjected to an external force, such as shock or vibration, because the first film 40 is chemically or electrically bonded to the heat dissipation member 30 and to the casing 1 (or the pedestal 50). Furthermore, the second film 60 can prevent the shifting of the heat dissipation member 30 even when the heat dissipation member 30 or the casing 1 is subjected to an external force, such as shock or vibration, because the second film 60 is chemically or electrically bonded to the heat dissipation member 30 and to the heat generating element 12. Thus, the third electronic control device of this embodiment can secure a heat dissipating path via the heat dissipation member 30 and suppress deterioration in heat dissipation properties even when the external force, such as shock or vibration, is applied on the electronic control device.

Figure 20:
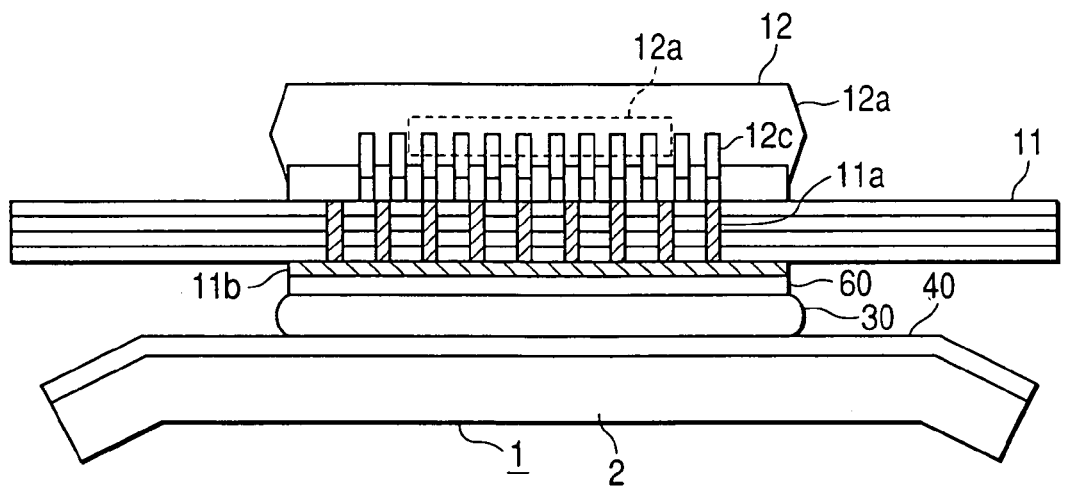
FIG. 20 is a vertical cross-sectional view showing another heat dissipating structure of the heat generating element in accordance with the third embodiment of the present invention.
Figure 21:
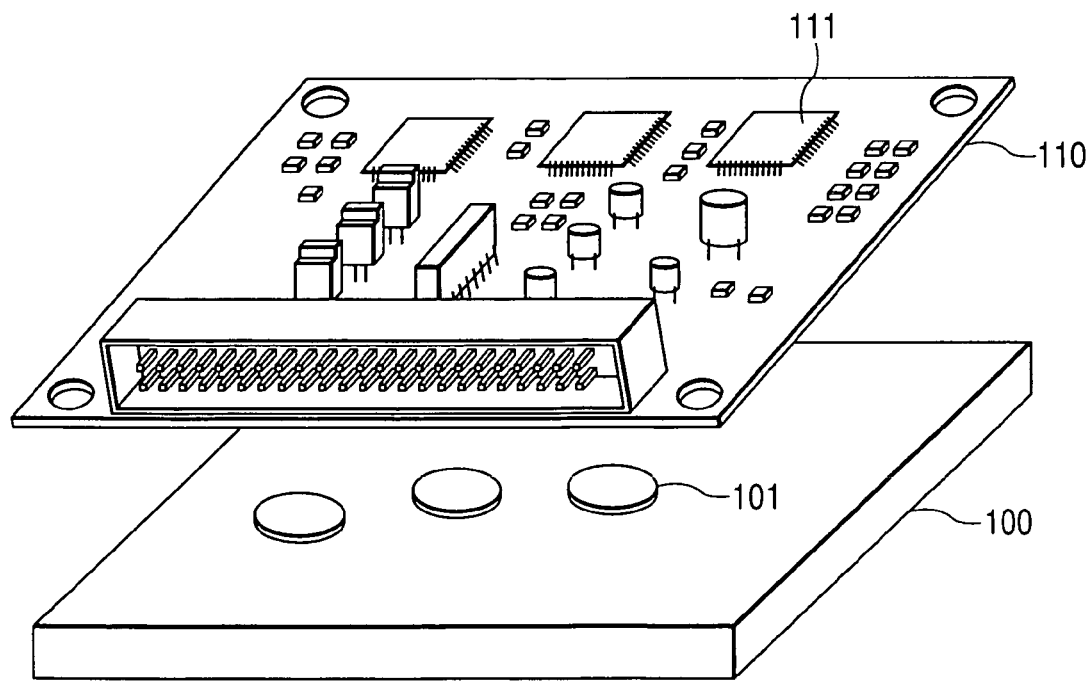
FIG. 21 is a perspective view showing a conventional electronic control device.
Figure 22:
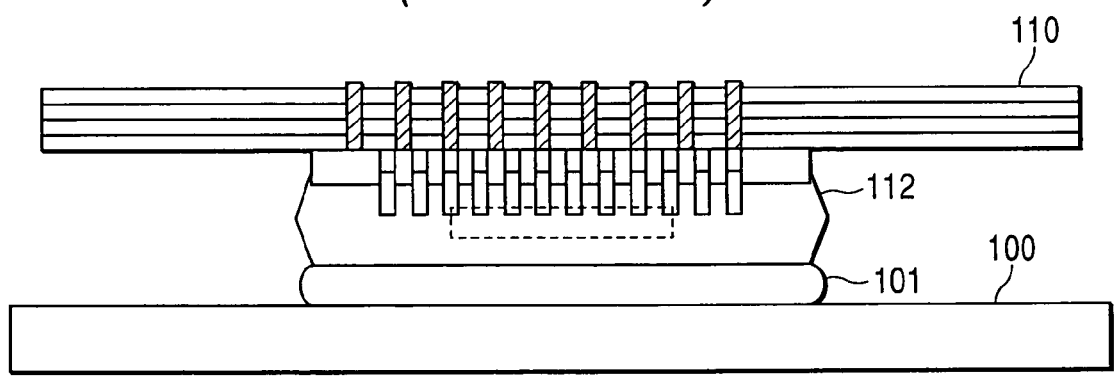
FIG. 22 is a vertical cross-sectional view showing a heat dissipating structure of a heat generating element according to the conventional electronic control device.
Figure 23:
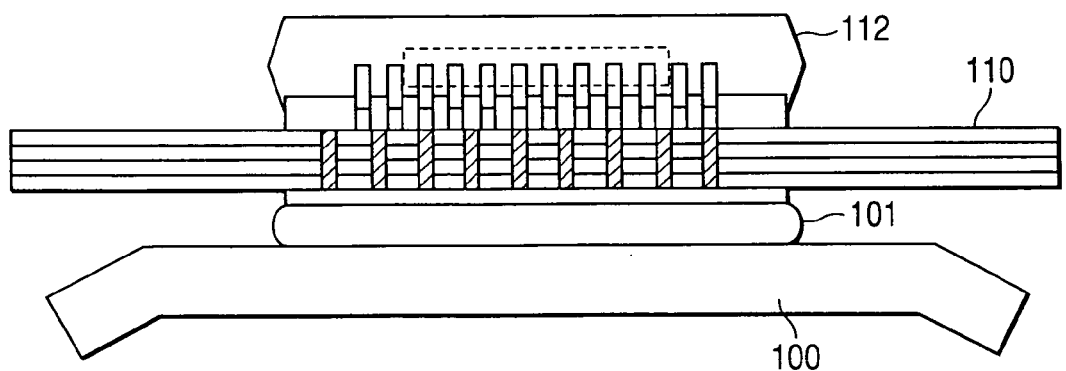
FIG. 23 is a vertical cross-sectional view showing a heat dissipating structure of a heat generating element according to the conventional electronic control device.

Furthermore, it is possible to employ a heat dissipating structure shown in FIG. 20 which is substantially a combination of the arrangement of the second embodiment shown in FIG. 18 (i.e. the arrangement including the shift preventing film 60) and the arrangement of the first embodiment shown in FIG. 4 (i.e. arrangement including the shift preventing film 40). More specifically, as is apparent from FIG. 20, one shift preventing film 40 is disposed between the heat dissipation member 30 and the inner surface of the casing 1 (or surface of the pedestal 50) and another shift preventing film 60 is disposed between the heat dissipation member 30 and the circuit board 11. The arrangement shown in FIG. 20 not only brings the functions and effects of the shift preventing film 40 (i.e. the functions and effects of the first embodiment) and the functions and effects of the shift preventing film 60 (i.e. the functions and effects of the second embodiment). As a result, this embodiment can surely prevent the heat dissipation member 30 from undesirably shifting.

According to the above another aspect of the third electronic control device, the heat dissipation member 30 is made of a polymeric material having fluidity. The first film 40 for preventing shifting of the heat dissipation member 30 is disposed between the heat dissipation member 30 and the inner surface of the casing 1 or the surface of the pedestal. The first film 40 is electrically and/or chemically bonded to the heat dissipation member 30 and to the casing 1 (or the pedestal 50). And, the second film 60 for preventing a shifting of the heat dissipation member 30 is disposed between the heat dissipation member 30 and the circuit board 11. The second film 60 is chemically or electrically bonded to the heat dissipation member 30 and to the circuit board 11. Thus, according to the above another aspect of the third electronic control device of this embodiment, no cracks occur when a stress is applied on the electronic control device because the heat dissipation member 30 is the polymeric material having fluidity. Furthermore, the first film 40 can prevent the shifting of the heat dissipation member 30 even when the heat dissipation member 30 or the casing 1 is subjected to an external force, such as shock or vibration, because the first film 40 is chemically and/or electrically bonded to the heat dissipation member 30 and to the casing 1 (or the pedestal 50). Furthermore, the second film 60 can prevent the shifting of the heat dissipation member 30 even when the heat dissipation member 30 or the casing 1 is subjected to an external force, such as shock or vibration, because the second film 60 is chemically or electrically bonded to the heat dissipation member 30 and to the circuit board 11. Thus, the above another aspect of the third electronic control device of this embodiment can secure a heat dissipating path via the heat dissipation member 30 and suppress deterioration in heat dissipation properties even when the external force, such as shock or vibration, is applied on the electronic control device.

What is claimed is:

1. An electronic control device, comprising:
   a circuit board accommodated in a casing and having mounted thereon electronic components including at least one heat-generating element; and
   a heat dissipation member having thermal conductivity and intervening between said heat-generating element or said circuit board and an inner surface of said casing or a surface of a pedestal thermally bonded to said casing, to provide thermal coupling between said heat-generating element and said casing,
   wherein
   said heat dissipation member is made of a polymeric material having fluidity and has two surfaces, one of which is in direct contact with said heat-generating element or said circuit board; and
   a film which prevents physical shifting of said heat dissipation member is disposed between said heat dissipation member and the inner surface of said casing or the surface of said pedestal, said film being chemically bonded to said heat dissipation member and said casing or said pedestal.

2. The electronic control device in accordance with claim 1, wherein said film is disposed on the inner surface of said casing or on the surface of said pedestal so as to entirely cover an area where said heat-generating element is mountable.

3. The electronic control device in accordance with claim 1, wherein said film is disposed on the inner surface of said casing or on the surface of said pedestal but not including an area where no heat dissipation is required.

4. The electronic control device in accordance with claim 1, wherein said heat dissipation member comprises a silicone resin material.

5. The electronic control device in accordance with claim 1, wherein said heat dissipation member comprises an epoxy resin material.

6. The electronic control device in accordance with claim 1, wherein said casing or said pedestal is a metallic material.

7. The electronic control device in accordance with claim 6, wherein said metallic material consists of aluminum.

8. The electronic control device in accordance with claim 1, wherein at least a surface layer of said casing or said pedestal is made of a resin material.

9. The electronic control device in accordance with claim 1, wherein said film is made of a material containing a benzene ring, a long hydrocarbon chain, or a combination thereof.

10. The electronic control device in accordance with claim 9, wherein said material containing the benzene ring or the long hydrocarbon chain is selected from the group consisting of polymer materials having long hydrocarbon chains bearing methyl groups and alcoholic OH groups, and benzene rings in the molecule, polymer materials having long hydrocarbon chains bearing methyl groups and amino groups, and benzene rings, polymer materials having long hydrocarbon chains bearing methyl groups and epoxy groups, and benzene rings, polymer materials having long hydrocarbon chains bearing methyl groups and sulfonate groups, and benzene rings, and polymer materials having long hydrocarbon groups bearing ethyl groups and alcoholic OH groups, and benzene rings.

11. The device according to claim 1, wherein said heat-generating element further comprises a heat dissipation plate that is exposed from a package of said heat-generating element, and one of surfaces of said heat dissipation member is in direct contact with the heat dissipation plate so as to be coupled thermally thereto.

12. An electronic control device, comprising:
   a circuit board disposed within a casing and having electronic components mounted thereon including at least one heat-generating element; and
   a heat dissipation member having thermal conductivity and intervening between said heat-generating element or said circuit board and an inner surface of said casing or a surface of a pedestal thermally bonded to said casing, to provide thermal coupling between said heat-generating element and said casing,
   wherein
   said heat dissipation member is made of a polymeric material having fluidity and has two surfaces, one of which is in direct contact with said heat-generating element or said circuit board, and
   a film which prevents physical shifting of said heat dissipation member is disposed between said heat dissipation member and said heat-generating element or said circuit board, said film being chemically bonded to said heat dissipation member and to said heat-generating element or said circuit board.

13. The electronic control device in accordance with claim 12, wherein said heat dissipation member comprises a silicone resin material.

14. The electronic control device in accordance with claim 12, wherein said heat dissipation member comprises an epoxy resin material.

15. The electronic control device in accordance with claim 12, wherein said film is made of a material containing a benzene ring or a long hydrocarbon chain.

16. The electronic control device in accordance with claim 15, wherein said material containing the benzene ring and/or the long hydrocarbon chain is selected from the group consisting of polymer materials having long hydrocarbon chains bearing methyl groups and alcoholic OH groups, and benzene rings in the molecule, polymer materials having long hydrocarbon chains bearing methyl groups and amino groups, and benzene rings, polymer materials having long hydrocarbon chains bearing methyl groups and epoxy groups, and benzene rings, polymer materials having long hydrocarbon chains bearing methyl groups and sulfonate groups, and benzene rings, and polymer materials having long hydrocarbon groups bearing ethyl groups and alcoholic OH groups, and benzene rings.

17. An electronic control device, comprising:
   a circuit board disposed within a casing and having electronic components mounted thereon including at least one heat-generating element; and
   a heat dissipation member having thermal conductivity and intervening between said heat-generating element or said circuit board and an inner surface of said casing or a surface of a pedestal thermally bonded to said casing, to provide thermal coupling between said heat-generating element and said casing, wherein said heat dissipation member is made of a polymeric material having fluidity and has two surfaces, one of which is in direct contact with said heat-generating element or said circuit board;

a first film which prevents physical shifting of said heat dissipation member is disposed between said heat dissipation member and the inner surface of said casing or the surface of said pedestal, said first film being chemically bonded to said heat dissipation member and to said casing or said pedestal; and a second film which prevents physical shifting of said heat dissipation member is disposed between said heat dissipation member and said heat-generating element or said circuit board, said second film being chemically bonded to said heat dissipation member and to said heat-generating element or said circuit board.

18. The electronic control device in accordance with claim 17, wherein said first film is disposed on the inner surface of said casing or on the surface of said pedestal so as to entirely cover an area where said heat-generating element is mountable.

19. The electronic control device in accordance with claim 17, wherein said first film is disposed on the inner surface of said casing or on the surface of said pedestal but not including an area where no heat dissipation is required.

20. The electronic control device in accordance with claim 17, wherein said heat dissipation member comprises a silicone resin material.

21. The electronic control device in accordance with claim 17, wherein said heat dissipation member comprises an epoxy resin material.

22. The electronic control device in accordance with claim 17, wherein said casing or said pedestal is a metallic material.

23. The electronic control device in accordance with claim 22, wherein said metallic material consists of aluminum.

24. The electronic control device in accordance with claim 17, wherein at least a surface layer of said casing or said pedestal is made of a resin material.

25. The electronic control device in accordance with claim 17, wherein each of said first and second films is made of a material containing a benzene ring or a long hydrocarbon chain.

26. The electronic control device in accordance with claim 25, wherein said material containing the benzene ring and/or the long hydrocarbon chain is selected from the group consisting of polymer materials having long hydrocarbon chains bearing methyl groups and alcoholic OH groups, and benzene rings in the molecule, polymer materials having long hydrocarbon chains bearing methyl groups and amino groups, and benzene rings, polymer materials having long hydrocarbon chains bearing methyl groups and epoxy groups, and benzene rings, polymer materials having long hydrocarbon chains bearing methyl groups and sulfonate groups, and benzene rings, and polymer materials having long hydrocarbon groups bearing ethyl groups and alcoholic OH groups, and benzene rings.

27. A unit for dissipating heat from a heat-generating electric component included in electronic components mounted on a circuit board, the unit comprising:

a casing in which the circuit board is housed;

a heat dissipating member which is thermally conductive, made of a polymeric material having fluidity, and is placed to receive heat generated from a heat-generating electronic component on the circuit board and to dissipate the received heat via the casing, wherein the heat dissipating member has two surfaces, one of which is in direct contact with the heat-generating element or the circuit board; and a shift preventing member which prevents the heat dissipating member from being physically shifted to the casing by using a bonding force generated by chemical bonding involving the heat dissipating member.

28. The unit in accordance with claim 27, wherein the circuit board has two exposed outer peripheral surfaces, the heat-generating electric component is arranged on one of the two surfaces of the circuit board, the heat dissipating member is arranged on the heat-generating electric component, and the shift preventing member is formed on the casing as a film so that the shift preventing member is sandwiched between the casing and the dissipating member with the bonding force operating therebetween.

29. The unit in accordance with claim 28, wherein the shift preventing member is formed directly on an inner surface of the casing.

30. The unit in accordance with claim 28, wherein the shift preventing member is formed on a protrusion which is formed on an inner surface of the casing.

31. The unit in accordance with claim 30, wherein the protrusion is protruded partly from the inner surface of the casing.

32. The unit in accordance with claim 30, wherein the protrusion is formed as a separate pedestal secured on the inner surface of the casing, the pedestal having a surface not only contacting the shift preventing member but also functionally forming a part of the inner surface of the casing.

33. The unit in accordance with claim 28, wherein the shift preventing member has a hardened surface layer formed thereon and the heat dissipating member has a hardened surface layer which comes in contact with the hardened surface layer of the shift preventing member.

34. The unit in accordance with claim 27, wherein the shift preventing member is formed between the heat-generating electric component and the heat dissipating member arranged on the casing so that the bonding force operates between the heat-generating electric component and the heat dissipating member.

35. The unit in accordance with claim 27, wherein the shift preventing member consists of first and second shift preventing members, the first shift preventing member being formed on the heat-generating electric component so as to be sandwiched between the heat-generating electric component and the heat dissipating member and the second shift preventing member being formed on the casing so as to be sandwiched between the heat dissipating member and the casing, wherein the bonding force operates between the first shift preventing member and the heat dissipating member and between the heat dissipating member and the second heat dissipating member, respectively.

36. The unit accordance with claim 27, wherein the circuit board has two exposed outer peripheral surfaces, the heat-generating electric component is arranged on one of the two surfaces of the circuit board, the heat dissipating member is positioned on the other of the two exposed surfaces of the circuit board, a heat conductive member is arranged to transmit the heat from the heat-generating electric component to the heat dissipating member.

37. The unit accordance with claim 36, wherein the heat conductive member is arranged on the circuit board and the heat dissipating member is arranged on the heat conductive member, and wherein the shift preventing member is formed on the casing so as to come into contact with the heat dissipating member with the bonding force operating therebetween.

38. The unit accordance with claim 36, wherein the heat conductive member is arranged on the circuit board, the shift preventing member is formed on the heat conductive member, and the heat dissipating member is formed on the casing to come into contact with the shift preventing member, the bonding force operating between the shift preventing member and the heat dissipating member.

39. The unit in accordance with claim 36, wherein the heat conductive member is arranged on the circuit board and the shift preventing member consists of:

first and second shift preventing members, the first shift preventing member being formed on the heat conductive member so as to be sandwiched between the heat conductive member and the heat dissipating member and the second shift preventing member being formed on the casing so as to be sandwiched between the heat dissipating member and the casing, wherein the bonding force operates between the first shift preventing member and the heat dissipating member and between the heat dissipating member and the second heat dissipating member, respectively.

40. The unit in accordance with claim 28, wherein the shift preventing member is made of a material containing either a benzene ring or a long hydrocarbon chain.

41. The unit in accordance with claim 27, wherein the shift preventing member is formed either locally or entirely over an area of an inner surface of the casing.

42. A unit for dissipating heat from a heat-generating electric component included in electronic components mounted on a circuit board, the unit comprising:

a casing in which the circuit board is housed;

heat dissipating means which is thermally conductive, made of a polymeric material having fluidity, and placed to receive the heat generated from heat-generating electronic component and dissipate the received heat via the casing, wherein the heat dissipating means is configured to have two surfaces, one of which is in direct contact with the heat-generating electric component or the circuit board; and shift preventing means for preventing the heat dissipating means from being shifted with respect to the casing by using a bonding force generated by chemical bonding involving the heat dissipating member.

* * * * *